United States Patent
Zhu et al.

(10) Patent No.: US 9,653,399 B2
(45) Date of Patent: May 16, 2017

(54) MIDDLE-OF-LINE INTEGRATION METHODS AND SEMICONDUCTOR DEVICES

(71) Applicant: QUALCOMM Incorporated, San Diego, CA (US)

(72) Inventors: John Jianhong Zhu, San Diego, CA (US); Da Yang, San Diego, CA (US); Jeffrey Junhao Xu, San Diego, CA (US); Stanley Seungchul Song, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/622,516

(22) Filed: Feb. 13, 2015

(65) Prior Publication Data
US 2016/0240485 A1 Aug. 18, 2016

(51) Int. Cl.
| | |
|---|---|
| *H01L 23/52* | (2006.01) |
| *H01L 23/532* | (2006.01) |
| *H01L 21/8238* | (2006.01) |
| *H01L 21/02* | (2006.01) |
| *H01L 21/311* | (2006.01) |
| *H01L 21/768* | (2006.01) |
| *H01L 23/528* | (2006.01) |
| *H01L 23/535* | (2006.01) |
| *H01L 23/522* | (2006.01) |

(52) U.S. Cl.
CPC .. *H01L 23/53295* (2013.01); *H01L 21/02178* (2013.01); *H01L 21/31111* (2013.01); *H01L 21/7681* (2013.01); *H01L 21/76802* (2013.01); *H01L 21/76816* (2013.01); *H01L 21/76877* (2013.01); *H01L 21/76895* (2013.01); *H01L 21/76897* (2013.01); *H01L 21/823821* (2013.01); *H01L 21/823828* (2013.01); *H01L 21/823871* (2013.01); *H01L 23/528* (2013.01); *H01L 23/5226* (2013.01); *H01L 23/535* (2013.01); *H01L 23/53257* (2013.01); *H01L 21/76831* (2013.01)

(58) Field of Classification Search
CPC ................................................. H01L 27/1023
See application file for complete search history.

(56) References Cited

U.S. PATENT DOCUMENTS

| | | | |
|---|---|---|---|
| 6,016,000 A | * | 1/2000 | Moslehi ............. H01L 23/5222 257/522 |
| 8,242,600 B2 | | 8/2012 | Yang et al. |
| 8,563,396 B2 | | 10/2013 | Purushothaman et al. |
| 8,564,132 B2 | | 10/2013 | Yang et al. |

(Continued)

OTHER PUBLICATIONS

International Search Report and Written Opinion—PCT/US2016/015923—ISA/EPO—May 13, 2016.

*Primary Examiner* — Elias M Ullah
(74) *Attorney, Agent, or Firm* — Toler Law Group, PC

(57) ABSTRACT

An electronic device includes a middle-of-line (MOL) stack. The electronic device includes a top local interconnect layer and a contact coupling the top local interconnect layer to a gate of a semiconductor device through a first dielectric layer. The electronic device also includes one or more isolation walls between the contact and the first dielectric layer, wherein the one or more isolation walls include aluminum nitride (AlN).

11 Claims, 22 Drawing Sheets

(56) References Cited

U.S. PATENT DOCUMENTS

| | | |
|---|---|---|
| 2004/0188842 A1 | 9/2004 | Takewaka et al. |
| 2006/0292823 A1* | 12/2006 | Ramanathan ..... H01L 21/76801 438/455 |
| 2013/0181330 A1 | 7/2013 | Ramachandran et al. |
| 2013/0307032 A1 | 11/2013 | Kamineni et al. |
| 2014/0077276 A1 | 3/2014 | Anderson et al. |
| 2014/0117420 A1 | 5/2014 | Chen et al. |
| 2014/0264926 A1 | 9/2014 | Wu et al. |

* cited by examiner

MIDDLE-OF-LINE INTEGRATION METHODS AND SEMICONDUCTOR DEVICES

I. FIELD

The present disclosure is generally related to middle-of-line (MOL) integration methods.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Such devices generally include integrated circuits, such as processors, memory arrays, etc. Middle-of-line (MOL) integration stages are used to form local interconnects between a transistor and a first metal interconnect layer within an integrated circuit. As integrated circuit device sizes decrease, complexity of processes used to form local interconnects has also increased. For example, MOL integration stages may use multiple masks and may have exacting specifications to align local interconnects with underlying transistor structures.

III. SUMMARY

A middle-of-line (MOL) stack described herein may be formed using fewer process steps, fewer masks, or both, as compared to other techniques (e.g., triple patterning lithography). For example, a MOL stack may be formed using self-aligned contact (SAC) etching. The MOL stack may include two dimensional (2-D) interconnect capability. For example, metal interconnects may be formed in both horizontal and vertical orientations.

In a particular example, an electronic device including an MOL stack is disclosed. The MOL stack includes a top local interconnect layer and a contact coupling the top local interconnect layer to a gate of a semiconductor device through a first dielectric layer. The MOL stack further includes one or more isolation walls between the contact and the first dielectric layer, wherein the one or more isolation walls include aluminum nitride (AlN).

In a particular aspect, a middle-of-line (MOL) integration method includes etching a first dielectric layer and a second dielectric layer to form a first trench. The first dielectric layer is positioned between the second dielectric layer and a gate of a semiconductor device. The method further includes depositing a dielectric material into the first trench.

In another aspect, a non-transitory computer-readable medium comprises processor-executable instructions that, when executed by a processor, cause the processor to initiate or control fabrication of an integrated circuit device. Fabricating the integrated circuit device includes etching a first dielectric layer and a second dielectric layer to form a first trench. The first dielectric layer is positioned between the second dielectric layer and a gate of a semiconductor device. Fabricating the integrated circuit device further includes depositing a dielectric material into the first trench and etching the dielectric material to form one or more isolation walls.

In another aspect, an electronic circuit device includes means for conducting and means for electrically coupling the means for conducting to a gate of a semiconductor device through a first dielectric layer. The electronic device further includes means for isolating located between the means for electrically coupling and the first dielectric layer, wherein the means for isolating includes aluminum nitride (AlN).

Aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1A:
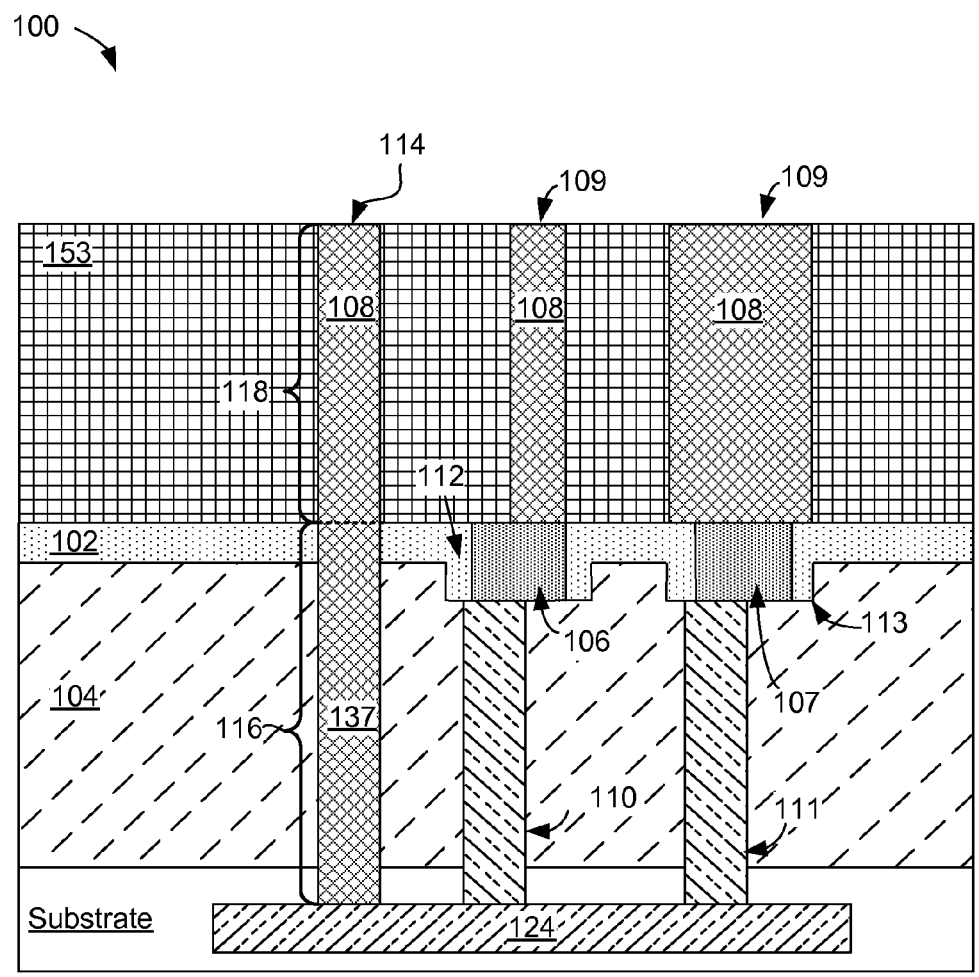
FIG. 1A illustrates a cross-sectional view of a device including one or more isolation walls between a contact and a first dielectric layer along line 179 of FIG. 1C.
Figure 1B:
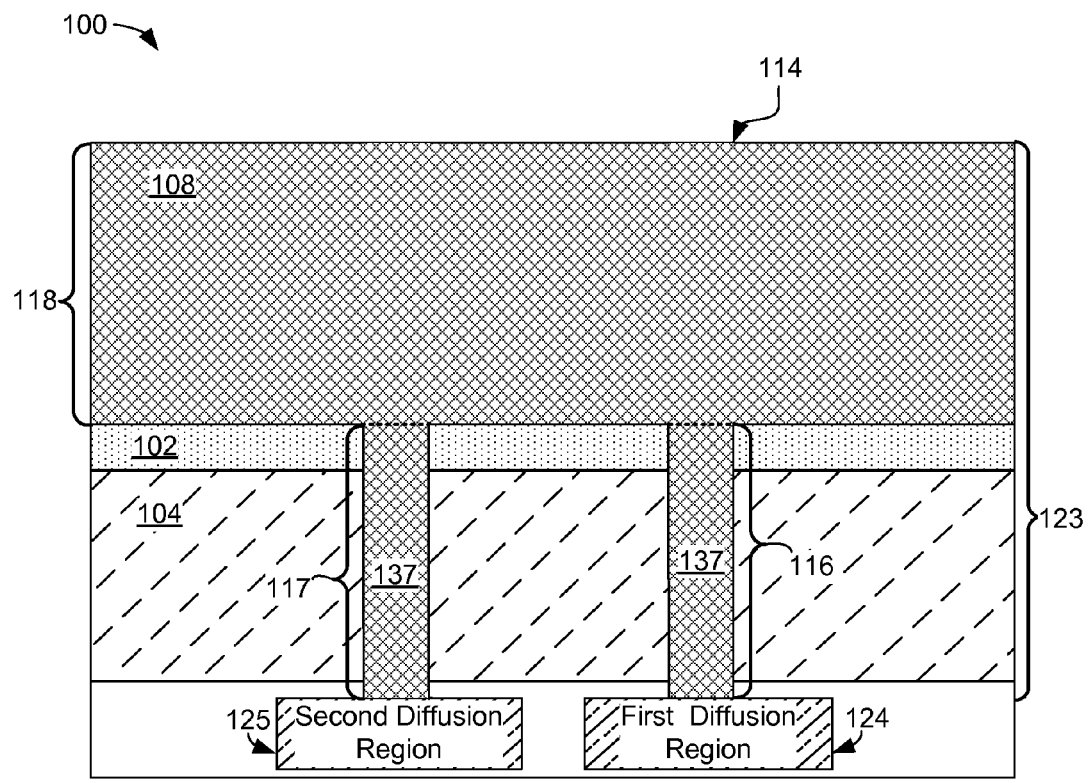
FIG. 1B illustrates a cross-sectional view of the device of FIG. 1A along line 150 of FIG. 1C.
Figure 1C:
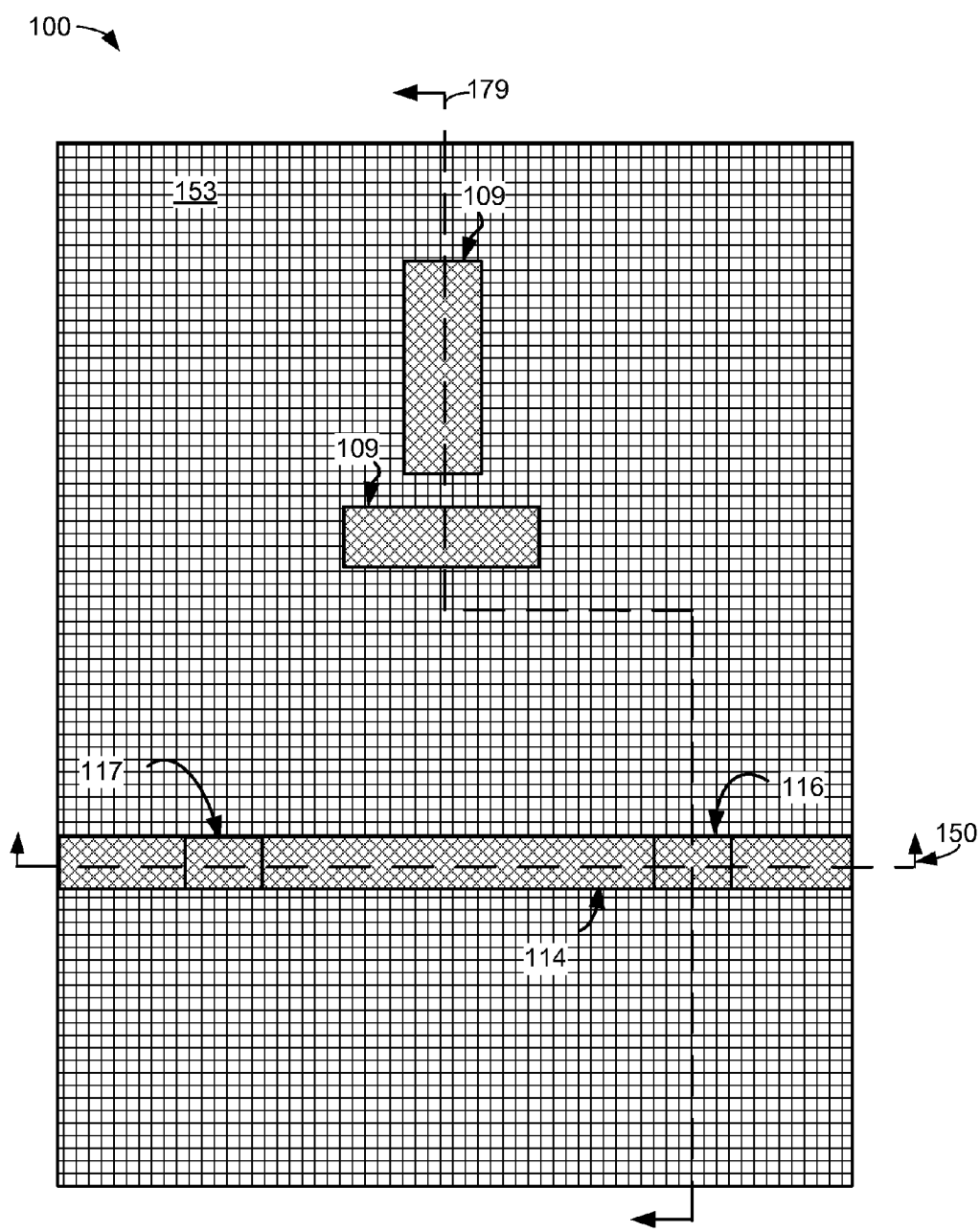
FIG. 1C illustrates a top view of the device of FIG. 1A.

FIGS. 1A, 1B, and 1C illustrate a semiconductor device structure showing an electronic device 100 (e.g., a middle-of-line ("MOL") stack) that may be formed using fewer process steps, fewer masks, or both, as compared to other techniques (e.g., triple patterning lithography). FIG. 1A shows a cross-sectional view of the electronic device 100 along line 179 of FIG. 1C, FIG. 1B shows a cross-sectional view of the electronic device 100 along line 150 of FIG. 1C, and FIG. 1C shows a top-down view of the electronic device 100. The electronic device 100 provides local interconnects (e.g., local interconnect structure 114 and contacts 109) between a first metal layer [not illustrated] M1 and portions of a transistor, such as diffusion regions and gates (e.g., gate stacks) 110 (e.g., a first gate) and 111 (e.g., a second gate). Although the electronic device 100 is illustrated as including two gates, the electronic device 100 may include more than two gates or less than two gates.

The electronic device 100 may include contacts that couple portions of a top local interconnect layer 108 (e.g., the contacts 109) to portions of the transistor (or another semiconductor device) through a first dielectric layer 104. For example, the electronic device 100 may include a first contact 106 that couples the top local interconnect layer 108 to the first gate 110 (e.g., of a first transistor) and a second contact 107 that couples the top local interconnect layer 108 to the second gate 111 (e.g., of a second transistor).

The electronic device 100 also includes a local interconnect structure 114 coupled to diffusion regions (such as a first diffusion region 124 and a second diffusion region 125) of the transistors. The local interconnect structure 114 may be formed of the local interconnect layers 123. The local interconnect layers 123 may include a portion of the top interconnect layer 108 (e.g., that forms a cross-member 118) and at least a portion of a lower interconnect layer 137 (e.g., that forms a first leg 116 and a second leg 117).

A via [not illustrated] (e.g., V0) may be formed proximate to the cross-member 118, and the first metal layer [not illustrated] M1 may be formed proximate to the via V0. The via V0 and the first metal layer M1 may be formed of copper (Cu) via a Cu dual damascene process. The local interconnect structure 114 may couple the via V0 and the first metal layer M1 to the first and second diffusion regions 124 and 125.

During operation, the first diffusion region 124 may correspond to a location of one or more first fins of an n-channel fin field effect transistor (FinFET), and the second diffusion region 125 may correspond to a location of one or more second fins of a p-channel FinFET. The first gate 110 may cooperate with the one or more first fins of the n-channel FinFET to form the n-channel FinFET. The first gate 110 may cooperate with the one or more second fins of the p-channel FinFET to form the p-channel FinFET. When the first diffusion region 124 and the second diffusion region 125 correspond to locations of fins of FinFETs, as described above, the first leg 116 of the local interconnect structure 114 may operate as a contact to a source/drain region of the one or more first fins of the n-channel FinFET and the second leg 117 may operate as a contact to a source/drain region of the one or more second fins of the p-channel FinFET. Although the electronic device 100 is illustrated as including one local interconnect structure 114, the electronic device 100 may include more than one local interconnect structure 114. For example, the electronic device 100 may include a second local interconnect structure [not illustrated] opposite the local interconnect structure 114 (and structured similarly to the local interconnect structure 114) so that the first gate 110 includes a source/drain terminal on both sides of the first gate 110. The local interconnect structure 114 and the second local interconnect structure [not illustrated] may operate to form a pair of cross-coupled FinFET transistors. For example, the local interconnect structure 114 and the second local interconnect structure [not illustrated] may operate to cross-couple the n-channel FinFET and the p-channel FinFET.

The electronic device 100 may also include a second dielectric layer 102 between the top local interconnect layer 108 and the first dielectric layer 104. The electronic device 100 may also include a third dielectric layer 153 between the top local interconnect layer 108 and the second dielectric layer 102. The second dielectric layer 102 may act as an etch stop layer during formation of the electronic device 100. For example, the material of the second dielectric layer 102 may exhibit a high etch selectivity ratio with respect to a material of the first dielectric layer 104 and the third dielectric layer 153. To illustrate, the first dielectric layer 104, the third dielectric layer 153, or both, may be formed of Silicon Dioxide ($SiO_2$), and the second dielectric layer 102 may be formed of Aluminum Nitride (AlN). The second dielectric layer 102 includes one or more isolation walls (e.g., isolation wall 112, isolation wall 113, or both) between the first contact 106 and the first dielectric layer 104.

The local interconnect structure 114 may be coupled to the first and second diffusion regions 124 and 125. The local interconnect structure 114 may include the first leg 116 (which extends through the second dielectric layer 102 and the first dielectric layer 104 to the first diffusion region 124) and the second leg 117 (which extends through the second dielectric layer 102 and the first dielectric layer 104 to the second diffusion region 125). At least a portion of at least one of the one or more isolation walls 112 or 113 may be between the first contact 106 and at least a portion of the local interconnect structure 114.

Figure 2:
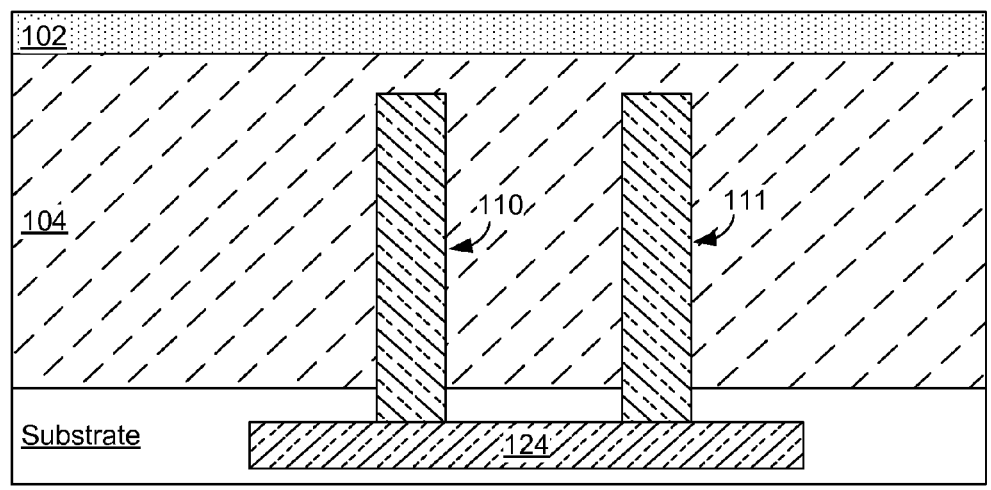
FIG. 2 illustrates a side view of a first particular stage of forming the device of FIGS. 1A, 1B, and 1C.

The electronic device 100 of FIGS. 1A, 1B, and 1C may be formed by methods described with reference to FIGS. 1A, 1B, 1C, 2, 3A, 3B, 4-6, 7A, 7B, 8A, 8B, 9A, 9B, 10, 11A, 11B, and 11C. FIG. 2 shows a side view (or a cross-sectional view along line 179 of FIG. 1C) during a first particular stage of forming the electronic device 100 of FIGS. 1A, 1B, and 1C. Forming the electronic device 100 includes forming (e.g., depositing) the first dielectric layer 104 on the substrate after formation of the first diffusion region 124 and the second diffusion region 125. Subsequently, the gates 110 and 111 may be formed and the second dielectric layer 102 is formed proximate to (e.g., on, above, over, adjacent to, or in direct contact with) the first dielectric layer 104. The second dielectric layer 102 may be formed using a deposition technique, such as chemical vapor deposition (CVD), to deposit the second dielectric layer 102 proximate to (e.g., on, above, over, adjacent to, or in direct contact with) the first dielectric layer 104.

Figure 3A:
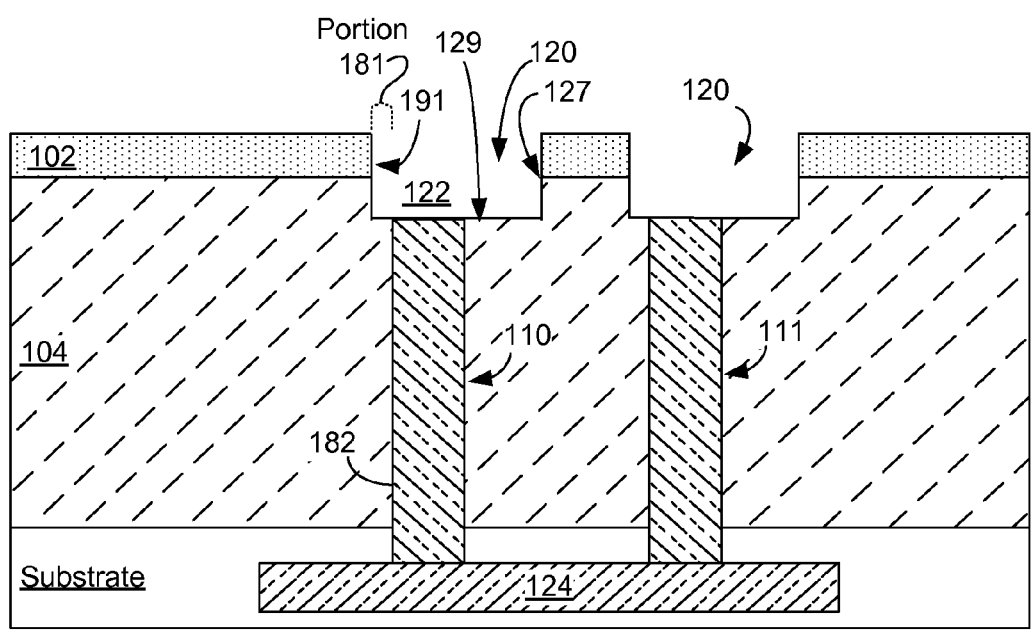
FIG. 3A illustrates a side view of a second particular stage of forming the device of FIGS. 1A, 1B, and 1C.
Figure 3B:
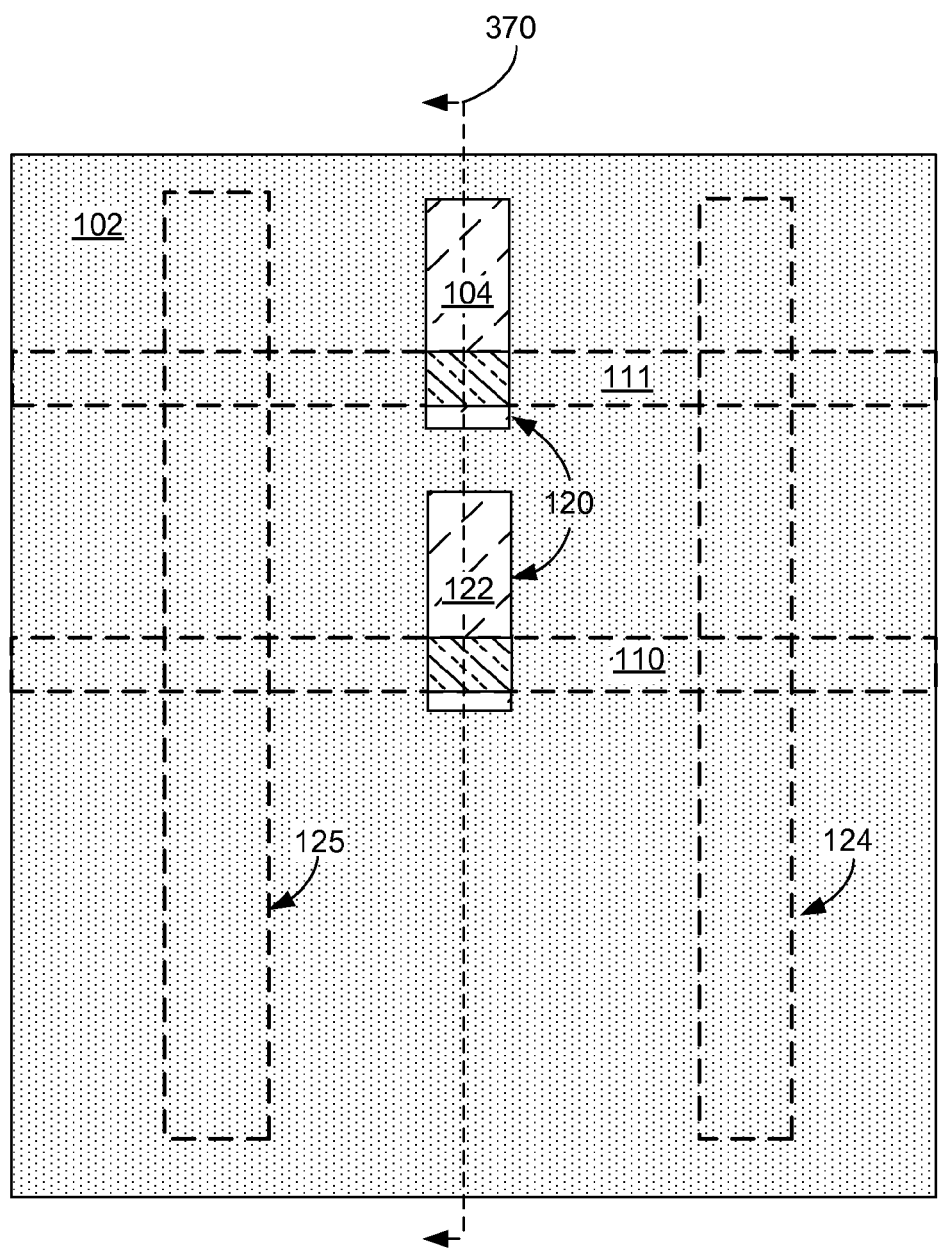
FIG. 3B illustrates a top view of the second particular stage of forming the device of FIGS. 1A, 1B, and 1C.

FIGS. 3A and 3B illustrate a second particular stage of forming the electronic device 100 of FIGS. 1A, 1B, and 1C. FIG. 3A shows a side view (or a cross-sectional view along line 179 of FIG. 1C) during the second particular stage. FIG. 3B shows a top view of the electronic device 100 during the second particular stage. For illustrative purposes, dashed lines in FIG. 3B indicate structures or regions below the second dielectric layer 102 that may not be visible in a top down view (e.g., the second dielectric layer 102 may obstruct view of the first and second diffusion regions 124, 125 and the gates 110, 111 in a top down view). At least one trench (e.g., the first trenches 120) is formed by etching the first dielectric layer 104 through an opening in the second dielectric layer 102. The opening in the second dielectric layer 102 through which the first dielectric layer 104 is etched may be formed by etching the second dielectric layer 102. The first dielectric layer 104 and the second dielectric layer 102 may be etched isotropically (e.g., using wet chemical etching) or anisotropically. One or more of the first trenches 120 may include a portion that laterally extends beyond an edge of one or more of the gates. For example, trench 122 may include a portion 181 that laterally extends beyond an edge 182 of the first gate 110.

Figure 4:
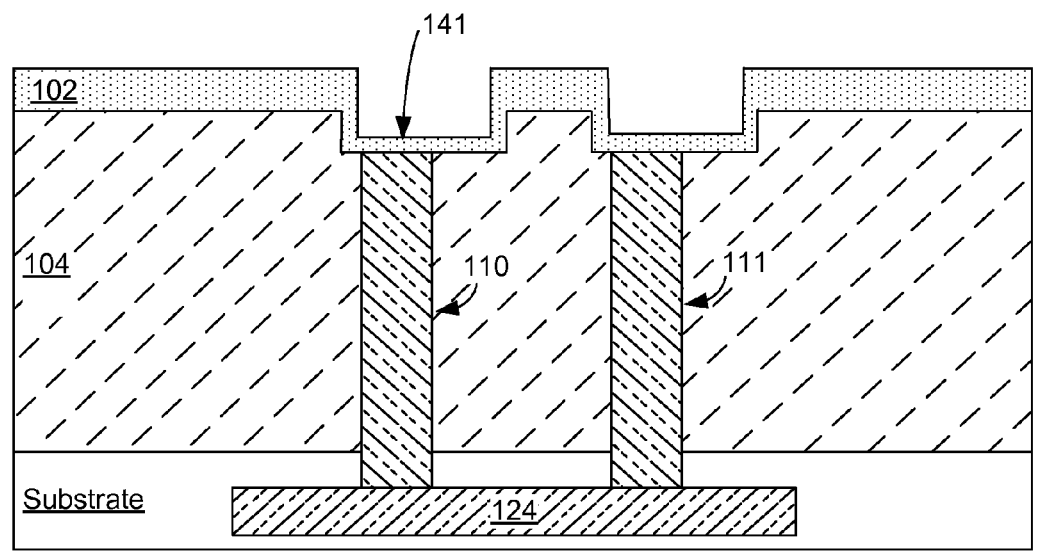
FIG. 4 illustrates a side view of a third particular stage of forming the device of FIGS. 1A, 1B, and 1C.

FIG. 4 is a side view (or a cross-sectional view along line 179 of FIG. 1C) showing a third particular stage during formation of the electronic device 100 of FIGS. 1A, 1B, and 1C. The third particular stage may occur or be performed after the second particular stage of FIGS. 3A and 3B. During the third particular stage of formation of the electronic device 100, additional dielectric material 141 of the second dielectric layer 102 may be deposited into one or more of the first trenches 120 of FIGS. 3A and 3B. For example, MN may be deposited into the one or more first trenches 120 of FIGS. 3A and 3B. The additional dielectric material 141 deposited into the one or more first trenches 120 may be deposited isotropically using a deposition technique, such as CVD. In some embodiments, the additional dielectric material 141 is deposited into the one or more first trenches 120 such that a layer (e.g., a thin layer) is applied to at least one of the side walls of the one or more first trenches 120. For example, the additional dielectric material 141 may be isotropically deposited into the one or more first trenches 120 such that a layer (e.g., a thin layer) is applied to at least a portion of sidewall 191 of the one or more first trenches 120. During the isotropic deposition of the additional dielectric material 141 into the one or more first trenches 120, in some examples, at least some of the additional dielectric material 141 is applied to at least a portion of a surface of the one or more first trenches 120 between sidewalls of the one or more first trenches 120. For example, during isotropic deposition of the additional dielectric material 141, at least some of the additional dielectric material 141 may be applied to surface 129 (e.g., a bottom surface) between sidewalls 191 and 127 of at least one of the one or more first trenches 120.

Figure 5:
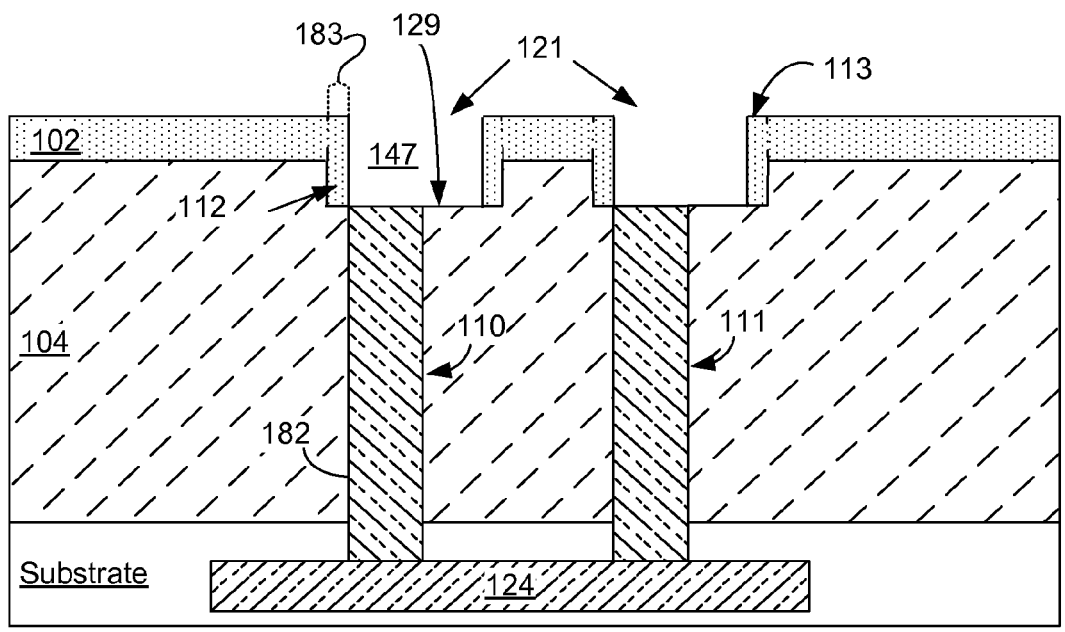
FIG. 5 illustrates a side view of a fourth particular stage of forming the device of FIGS. 1A, 1B, and 1C.

FIG. 5 is a side view (or a cross-sectional view along line 179 of FIG. 1C) showing a fourth particular stage of forming the electronic device 100 of FIGS. 1A, 1B, and 1C. The fourth particular stage may occur or be performed after the third particular stage of FIG. 4. During the fourth particular stage of forming the electronic device 100, a portion of the additional dielectric material 141 deposited into the one or more first trenches 120 may be removed (e.g., etched) to form one or more second trenches 121. For example, at least a portion of the additional dielectric material 141 applied to a surface between sidewalls of the first trenches 120 may be etched isotropically (e.g., using wet chemical etching) or anisotropically to form the one or more second trenches 121. For example, a layer of the additional dielectric material 141 applied to the surface 129 of the trench 122 (e.g., between the sidewalls 191 and 127) may be etched, thereby forming second trench 147 and exposing the first gate 110.

One or more portions of the additional dielectric material 141 proximate to one or more of the sidewalls 191, 127 of the one or more first trenches 120 may remain to form the one or more isolation walls 112, 113. At least one of the one or more isolation walls 112, 113 (e.g., the isolation wall 112) may be proximate (e.g., on, over, above, or adjacent) to a top of the first gate 110. In some embodiments, at least a portion of the one or more of the isolation walls 112, 113 laterally extends beyond an edge of one or more of the gates 110, 111. For example, a portion 183 of the isolation wall 112 may laterally extend beyond the edge 182 of the first gate 110.

Figure 6:
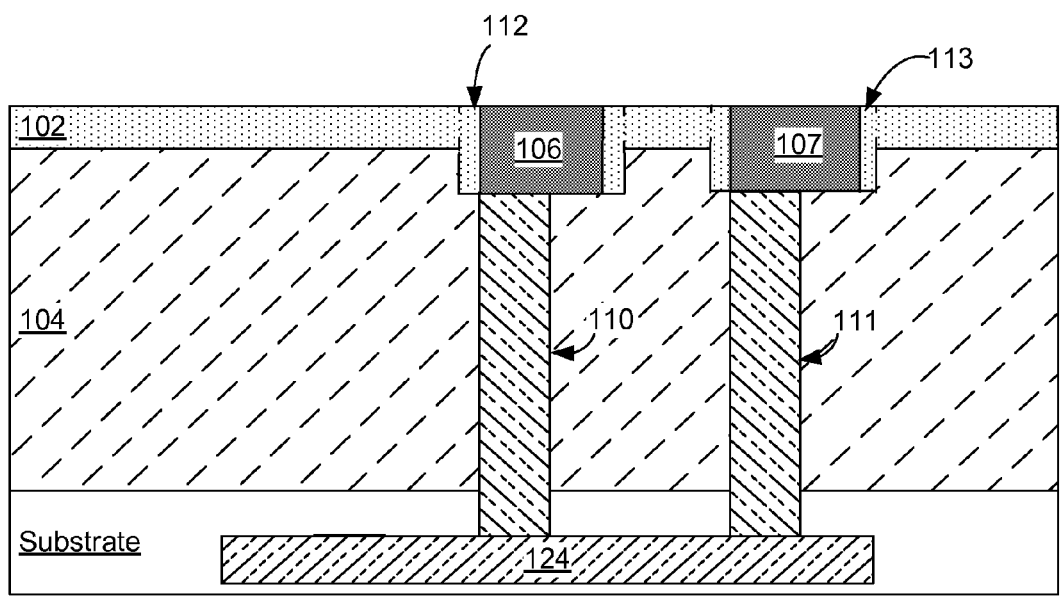
FIG. 6 illustrates a side view of a fifth particular stage of forming the device of FIGS. 1A, 1B, and 1C.

FIG. 6 is a side view (or a cross-sectional view along line 179 of FIG. 1C) showing a fifth particular stage of forming the electronic device 100 of FIGS. 1A, 1B, and 1C. The fifth particular stage may occur or be performed after the fourth particular stage of FIG. 5. During the fifth particular stage of forming the electronic device 100, contacts 106 and 107 may be formed (e.g., by deposition). The contacts 106 and 107 may include a conductive material, such as metal. For example, the contacts 106 and 107 may be formed of, or may include, tungsten (W). Additionally, after depositing a material to form the contacts 106 and 107, the electronic device 100 may be planarized. For example, the electronic device 100 may be planarized using CMP.

Figure 7A:
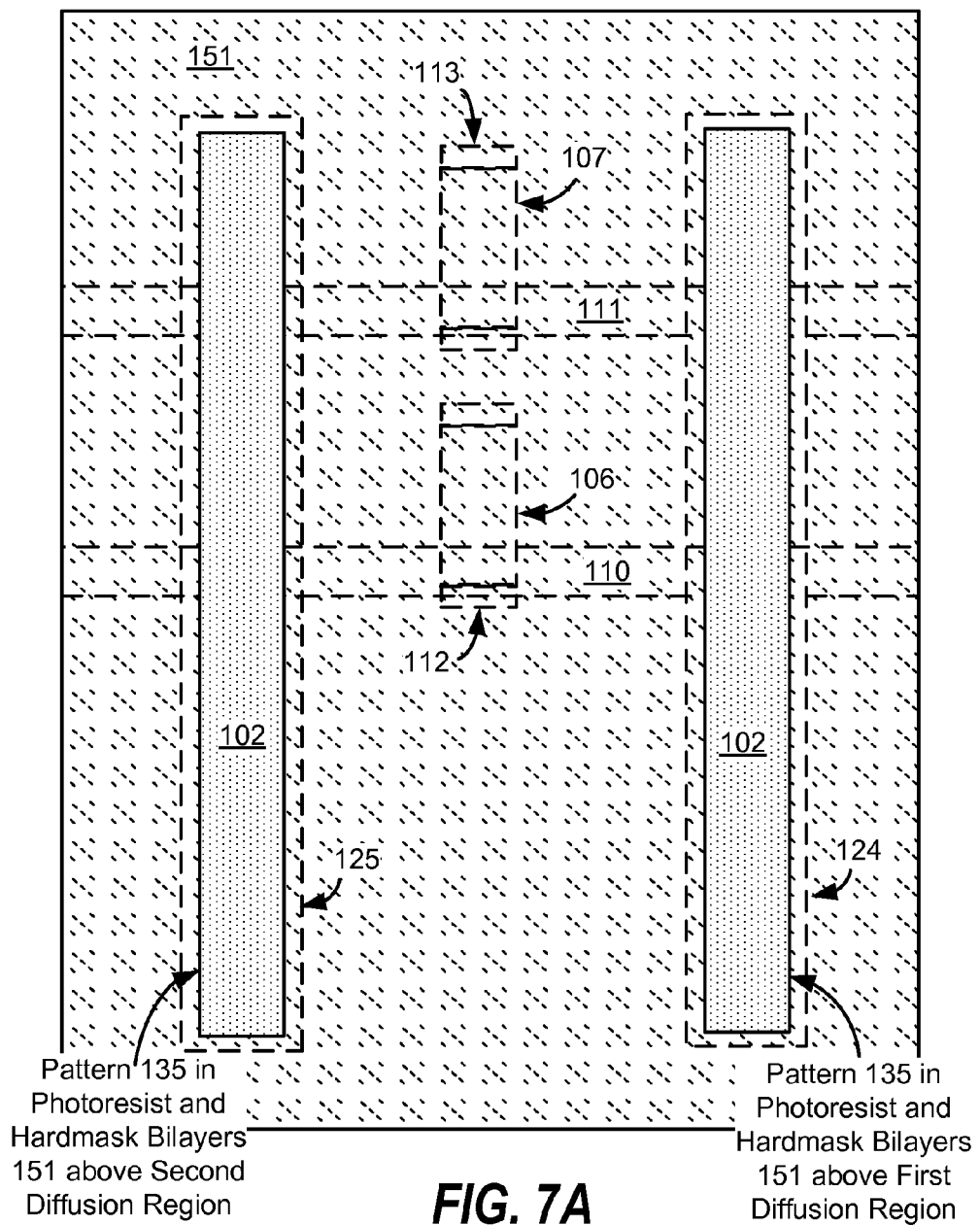
FIG. 7A illustrates a top view of a sixth particular stage of forming the device of FIGS. 1A, 1B, and 1C.
Figure 7B:
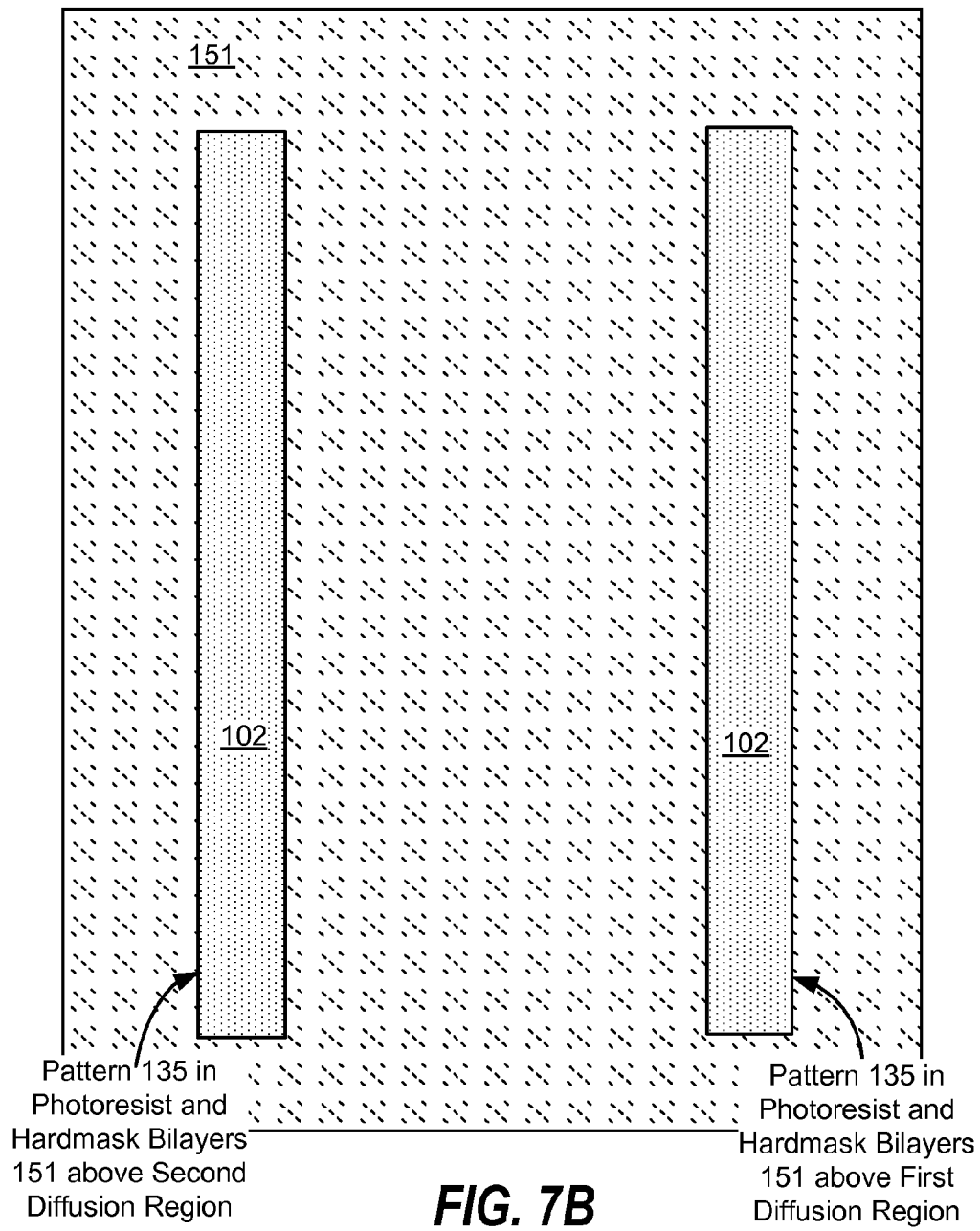
FIG. 7B illustrates a top view of the sixth particular stage of forming the device of FIGS. 1A, 1B, and 1C.

FIGS. 7A and 7B are top views showing a sixth particular stage during formation of the electronic device 100 of FIGS. 1A, 1B, and 1C. For illustrative purposes, dashed lines in FIG. 7A indicate structures or regions below first photoresist and hardmask bilayers 151 and the second dielectric layer 102 that may not be visible in a top down view (e.g., the first photoresist and hardmask bilayers 151 and/or the second dielectric layer 102 may obstruct a view of the first and second diffusion regions 124, 125, the gates 110, 111, the contacts 106, 107, and the isolation walls 112, 113 in a top down view). FIG. 7B is a top down view that does not illustrate structures or regions that may not be visible in a top down view (e.g., below the first photoresist and hardmask bilayers 151 and/or the second dielectric layer 102). The sixth particular stage may occur or be performed after the fifth particular stage. In the sixth particular stage, a hardmask layer (e.g., hardmask layer 152 of FIGS. 8A and 8B) of the first photoresist and hardmask bilayers 151 may be formed proximate to the second dielectric layer 102 and a photoresist layer of the first photoresist and hardmask bilayers 151 may be formed proximate to the hardmask layer. The photoresist layer of the first photoresist and hardmask bilayers 151 may be patterned proximate to (e.g., above or over) the first diffusion region 124 and the second diffusion region 125. For example, the photoresist layer of the first photoresist and hardmask bilayers 151 may be patterned using a first photolithographic step to apply a first photomask to form a pattern 135 in the photoresist layer (of the first photoresist and hardmask bilayers 151) in a particular orientation (e.g., a horizontal orientation). The pattern 135 formed in the photoresist layer of the first photoresist and hardmask bilayers 151 may be transferred to the hardmask layer of the first photoresist and hardmask bilayers 151 (e.g., using an etch process). The pattern 135 may subsequently be used during a self-aligned contact (SAC) etch. As used herein "self-aligned" includes using a single photomask to form an initial pattern upon which other features are based. For example, the pattern 135 may be used to form the openings 130 and 131 in the second dielectric layer 102. As described below, second photoresist and hardmask bilayers (e.g., second photoresist and hardmask bilayers 155 of FIGS. 9A and 9B) may be formed, patterned, and used to etch material through portions of the openings 130 and 131.

Figure 8A:
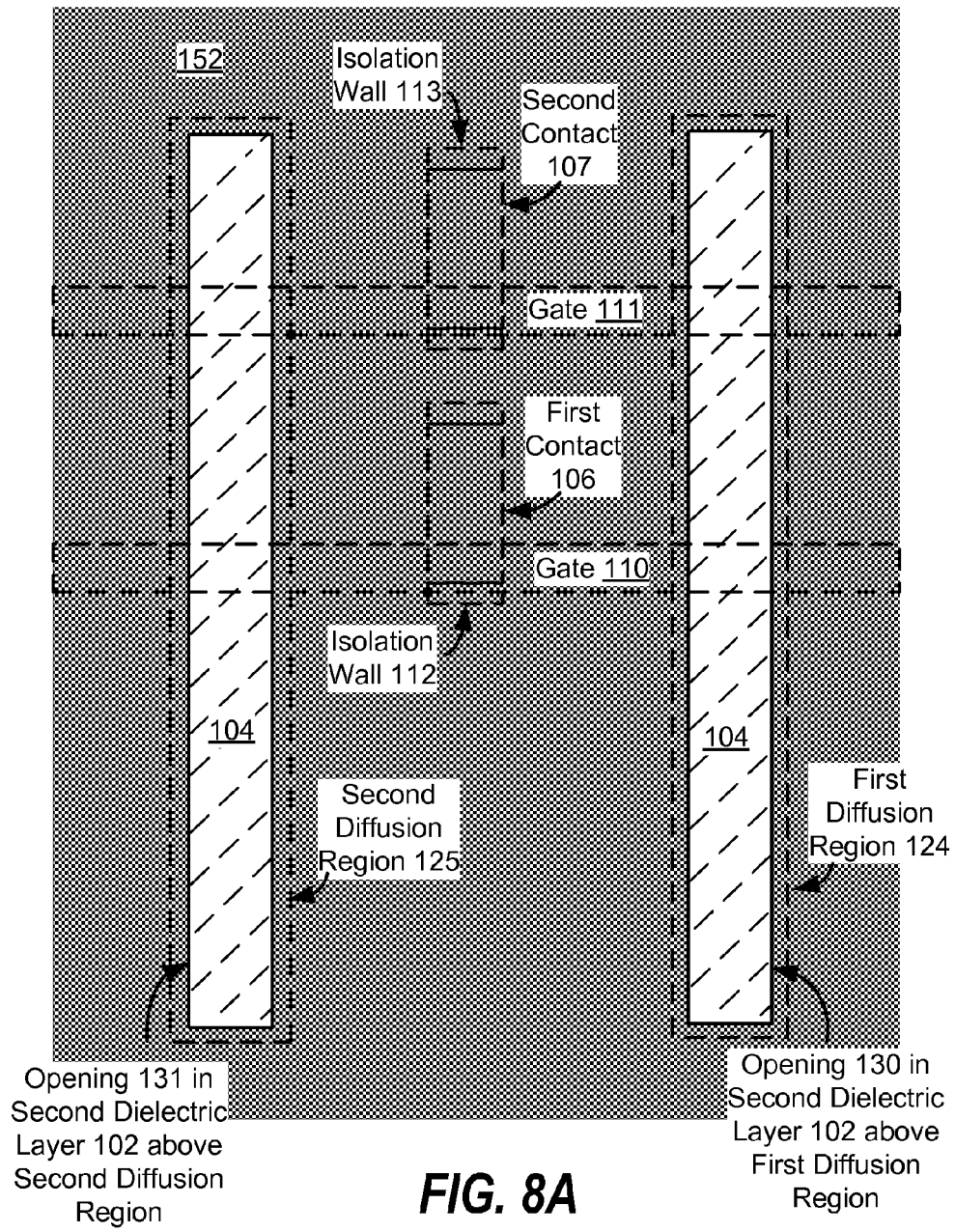
FIG. 8A illustrates a top view of a seventh particular stage of forming the device of FIGS. 1A, 1B, and 1C.
Figure 8B:
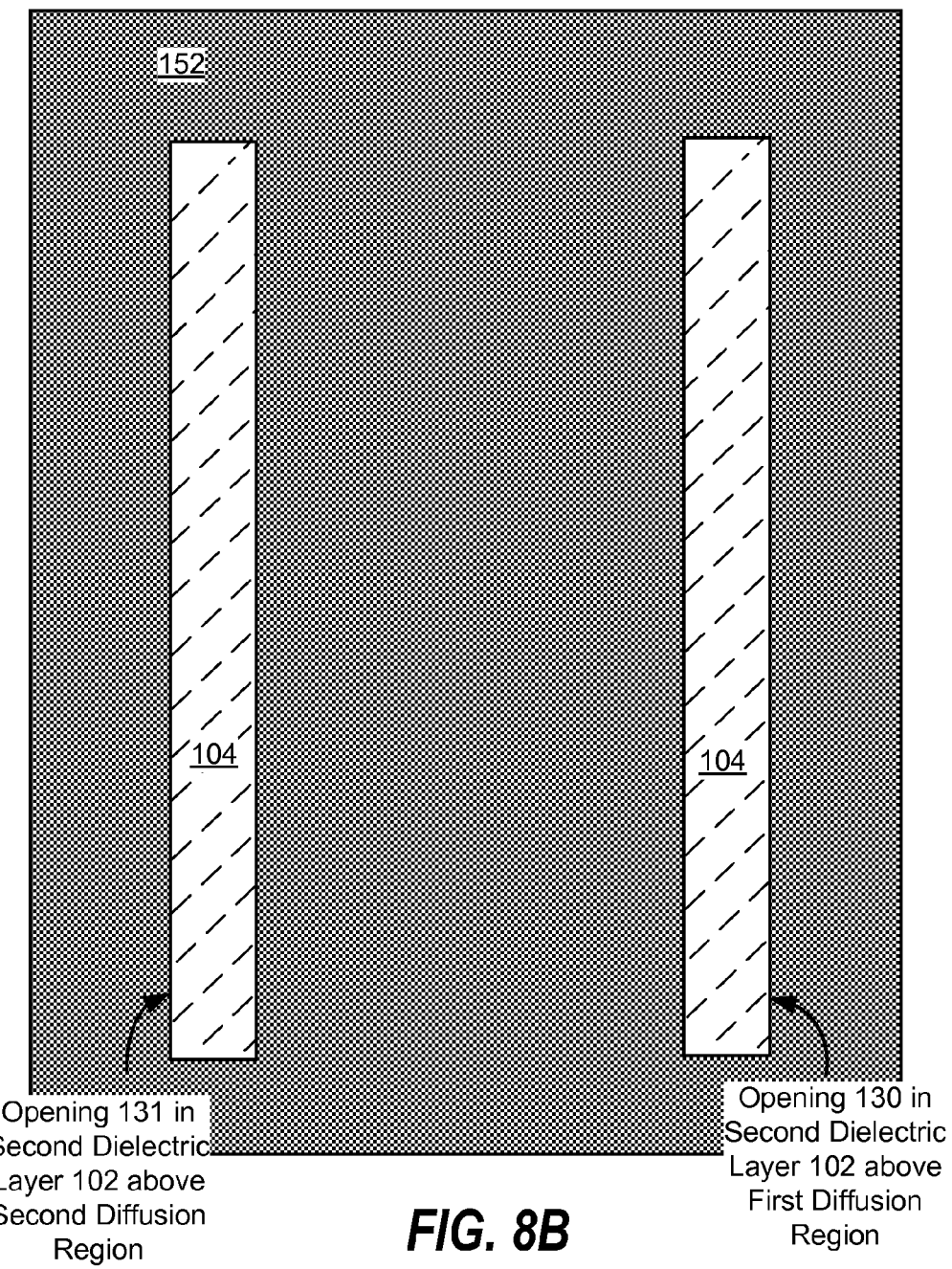
FIG. 8B illustrates a top view of the seventh particular stage of forming the device of FIGS. 1A, 1B, and 1C.

FIGS. 8A and 8B are top views showing a seventh particular stage during formation of the electronic device 100 of FIGS. 1A, 1B, and 1C. For illustrative purposes, dashed lines in FIG. 8A indicate structures or regions below the hardmask layer 152 (of the first photoresist and hardmask bilayers 151 of FIGS. 7A and 7B) and the second dielectric layer 102 that may not be visible in a top down view. FIG. 8B is a top down view that does not illustrate structures or regions that may not be visible in a top down view (e.g., structures or regions below the hardmask layer 152 and the second dielectric layer 102). The seventh particular stage may occur or be performed after the sixth particular stage. In the seventh particular stage, one or more openings may be formed in the second dielectric layer 102 proximate to (e.g., above or over) one or more diffusion regions. For example, the opening 130 may be formed in a portion of the second dielectric layer 102 over or above the first diffusion region 124, and the opening 131 may be formed in a portion of the second dielectric layer 102 over or above the second diffusion region 125. The openings 130 and 131 may be formed in the second dielectric layer 102 by etching the second dielectric layer 102 through the patterned first photoresist and hardmask bilayers 151 of FIGS. 7A and 7B (e.g., through the pattern 135 of FIGS. 7A and 7B). Forming the openings 130 and 131 may expose at least a portion of the first dielectric layer 104 above or over the first and second diffusion regions 124, 125. The second dielectric layer 102 may be etched through the patterned first photoresist and hardmask bilayers 151 of FIGS. 7A and 7B isotropically (e.g., using wet chemical etching) or anisotropically. Because of the different etch characteristics of the second dielectric layer 102 and the first dielectric layer 104, the first dielectric layer 104 is not etched (or is not etched significantly) during this etch step.

Figure 9A:
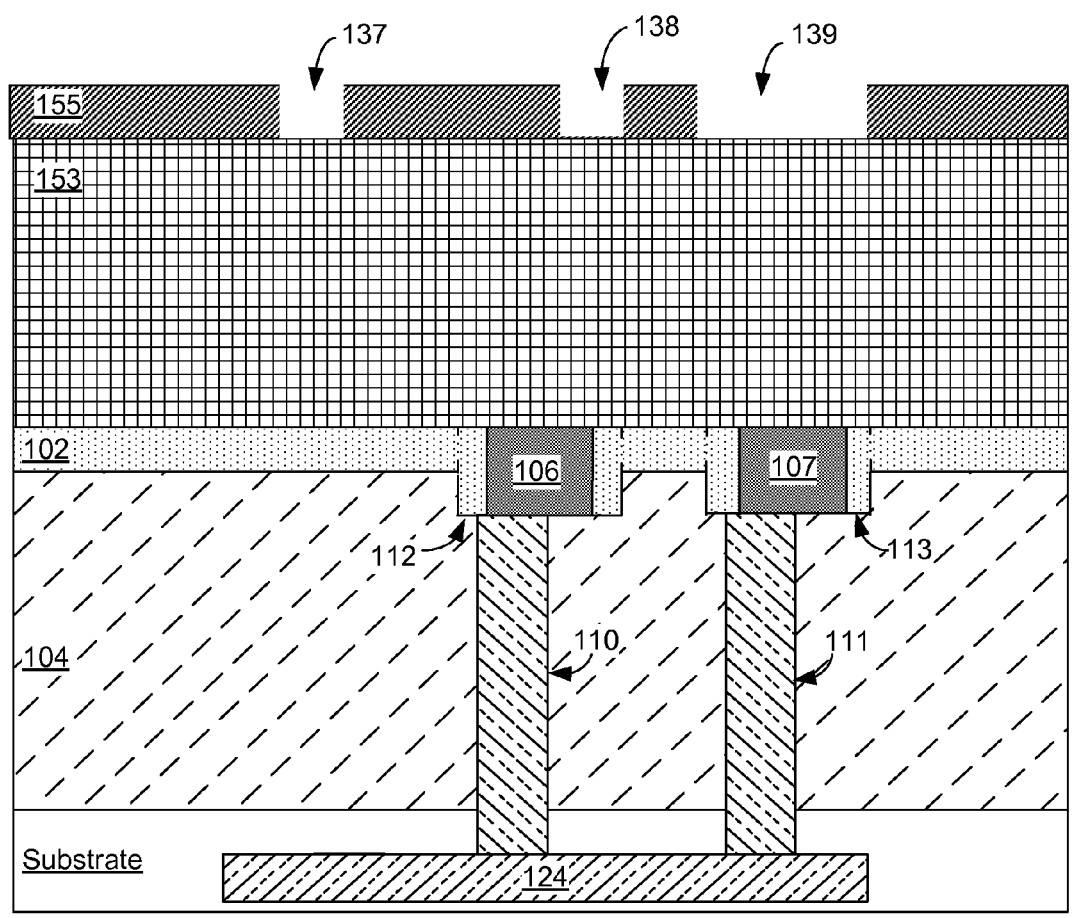
FIG. 9A illustrates a cross-sectional view along line 370 of FIG. 9B of an eighth particular stage of forming the device of FIGS. 1A, 1B, and 1C.
Figure 9B:
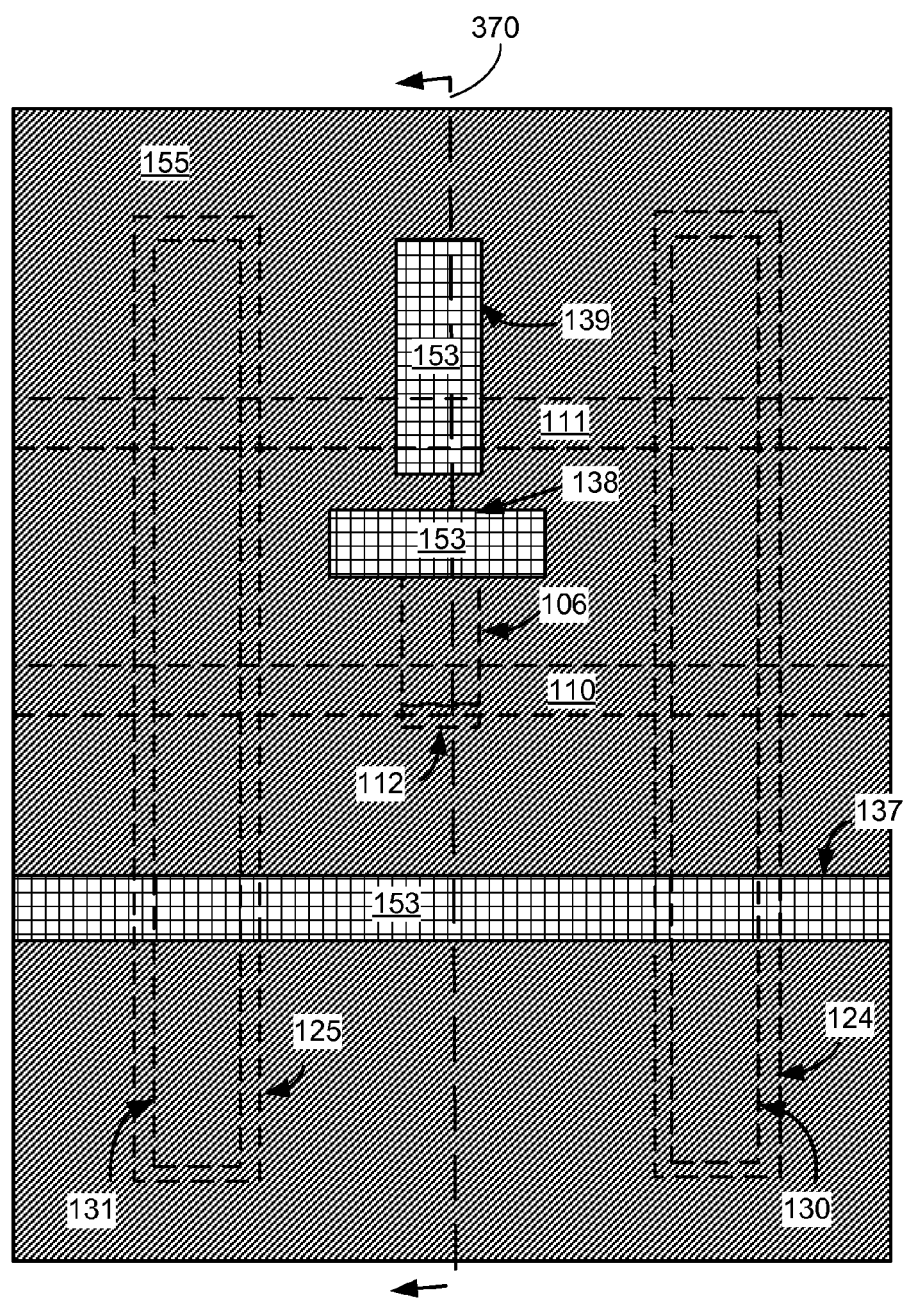
FIG. 9B illustrates a top view of the eighth particular stage of forming the device of FIGS. 1A, 1B, and 1C.

FIG. 9A is a cross-sectional view along line 370 of FIG. 9B during an eighth particular stage of forming the electronic device 100 of FIGS. 1A, 1B, and 1C, and FIG. 9B is a top view of the eighth particular stage of forming the electronic device 100 of FIGS. 1A, 1B, and 1C. For illustrative purposes, dashed lines in FIG. 9A indicate structures or regions that may not be visible in a top-down view (e.g., structures or regions that may be obscured by (e.g., below) second photoresist and hardmask bilayers 155, the third dielectric layer 153, and/or the second dielectric layer 102). The eighth stage may occur or be performed after the seventh particular stage. In the eighth stage, portions of the first photoresist and hardmask bilayers 151 of FIGS. 7A and 7B (e.g., the hardmask layer 152 of FIGS. 8A and 8B) remaining after formation of the openings 130 and 131 of FIGS. 8A and 8B may be removed and a third dielectric layer 153 of FIGS. 9A and 9B may be deposited proximate to (e.g., above, over, on, in direct contact with, or adjacent to) the second dielectric layer 102. The third dielectric layer 153 may be formed of the same material as the first dielectric layer 104. For example, the third dielectric layer 153 may be formed of SiO2. A hardmask layer (e.g., a hardmask layer 156 of FIGS. 10, 11A, and 11B) of the second photoresist and hardmask bilayers 155 of FIGS. 9A and 9B may be formed proximate to (e.g., above, over, on, in direct contact with, or adjacent to) the third dielectric layer 153, and a photoresist layer of the second photoresist and hardmask bilayers 155 may be formed proximate to the hardmask layer 156. The photoresist layer of the second photoresist and hardmask bilayers 155 may be patterned using a second photolithographic step to apply a second photomask to form one or more patterns 137, 138, or 139 in the photoresist layer (of the second photoresist and hardmask bilayers 155) in multiple orientations (e.g., vertical and horizontal orientations). For example, the patterns 137 and 138 may be formed in a vertical orientation and the pattern 139 may be formed in a horizontal orientation. The second photomask may be applied using a single extreme ultraviolet (EUV) photomask. The patterns 137, 138, and 139 in the photoresist layer of the second photoresist and hardmask bilayers 155 may be transferred to the hardmask layer 156 (e.g., using an etch process), thereby forming the patterns 137, 138, and 139 in the second photoresist and hardmask bilayers 155.

Figure 10:
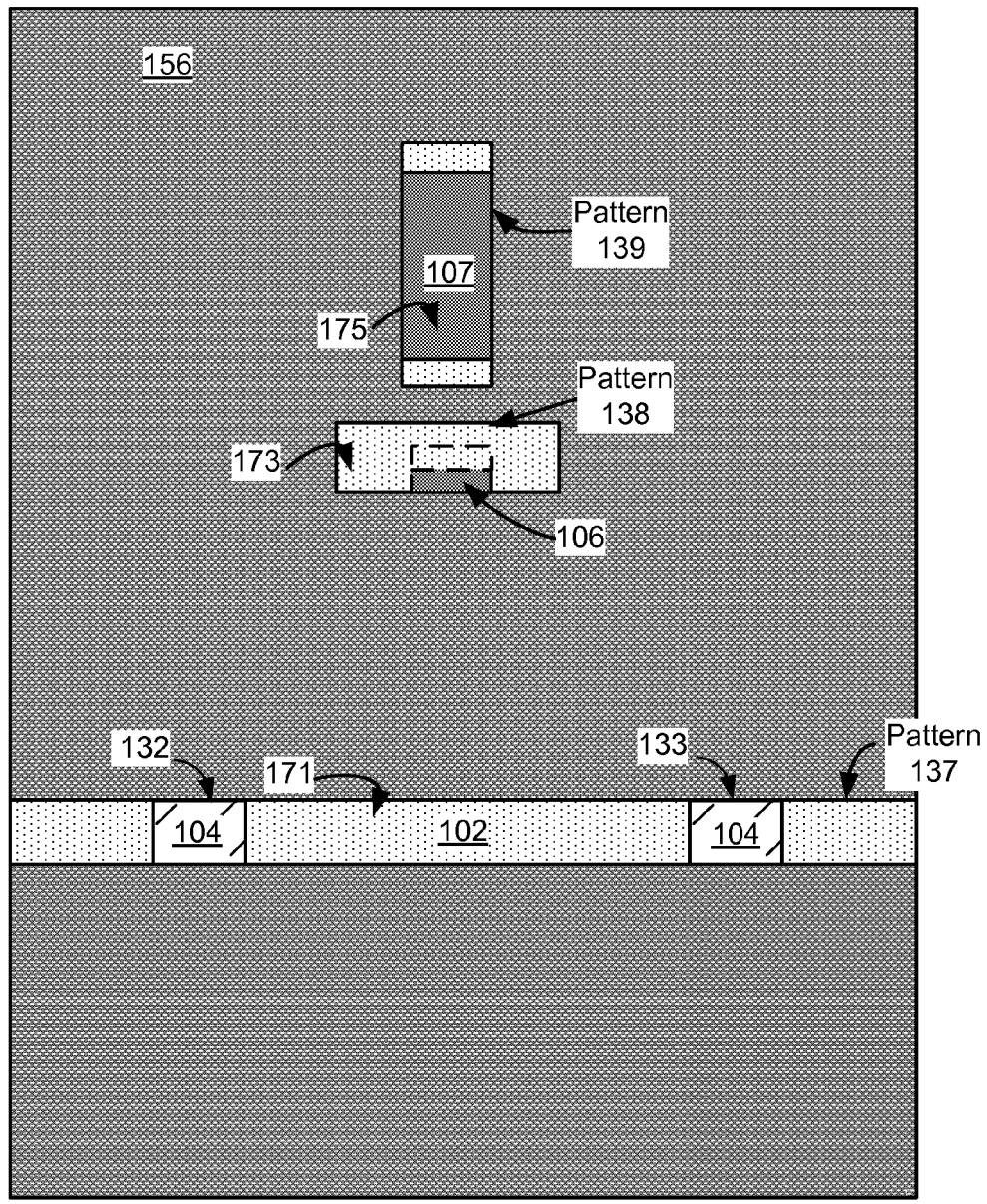
FIG. 10 illustrates is a top view of a ninth particular stage of forming the device of FIGS. 1A, 1B, and 1C.

FIG. 10 is a top view during a ninth particular stage of forming the electronic device 100 of FIGS. 1A, 1B, and 1C. During the ninth particular stage of forming the electronic device 100 of FIGS. 1A, 1B, and 1C, the third dielectric layer 153 of FIGS. 9A and 9B is etched (e.g., in a first etch stage). The third dielectric layer 153 of FIGS. 9A and 9B may be etched through the patterns 137, 138, and 139 in the second photoresist and hardmask bilayers 155 of FIGS. 9A and 9B (e.g., etched through the patterns 137, 138, and 139 in the hardmask layer 156). Etching the third dielectric layer 153 through the patterns 137, 138, and 139 may form trenches 171, 173, and 175, respectively, of FIG. 10. Etching the third dielectric layer 153 of FIGS. 9A and 9B may expose the first dielectric layer 104 of FIG. 10 at regions 132 and 133. The regions 132 and 133 may correspond to portions of the first opening 130 and the second opening 131 (in the second dielectric layer 102) that are proximate to the pattern 137 (e.g., portions of the first opening 130 and the second opening 131 that intersect the pattern 137). Etching the third dielectric layer 153 of FIGS. 9A and 9B may also expose portions of the first contact 106 and the second contact 107. Because of the different etch characteristics of the second dielectric layer 102 and the third dielectric layer 153, the etching of the third dielectric layer 153 may not etch through the second dielectric layer 102.

Figure 11A:
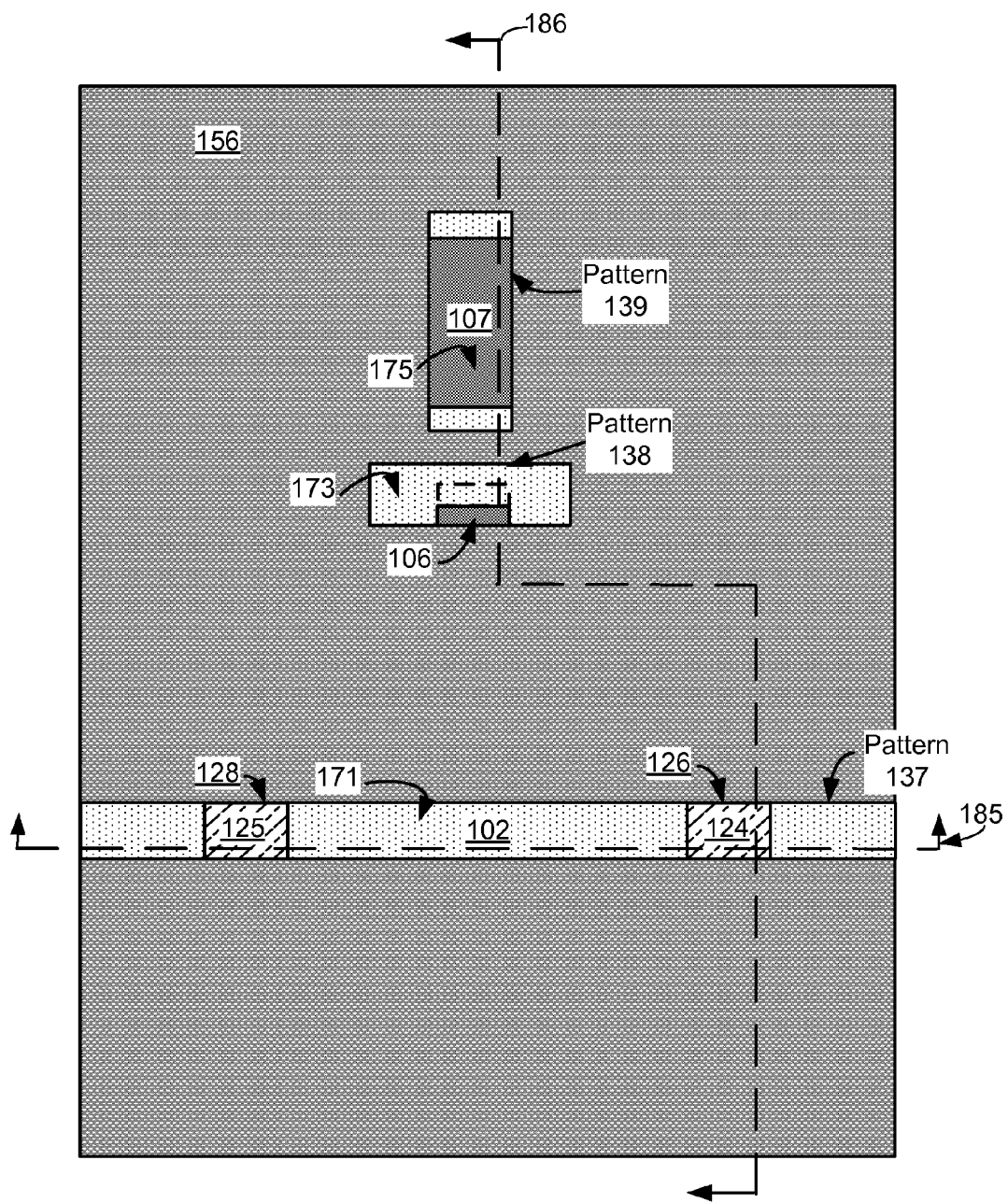
FIG. 11A illustrates a top view of a tenth particular stage of forming the device of FIGS. 1A, 1B, and 1C.
Figure 11B:
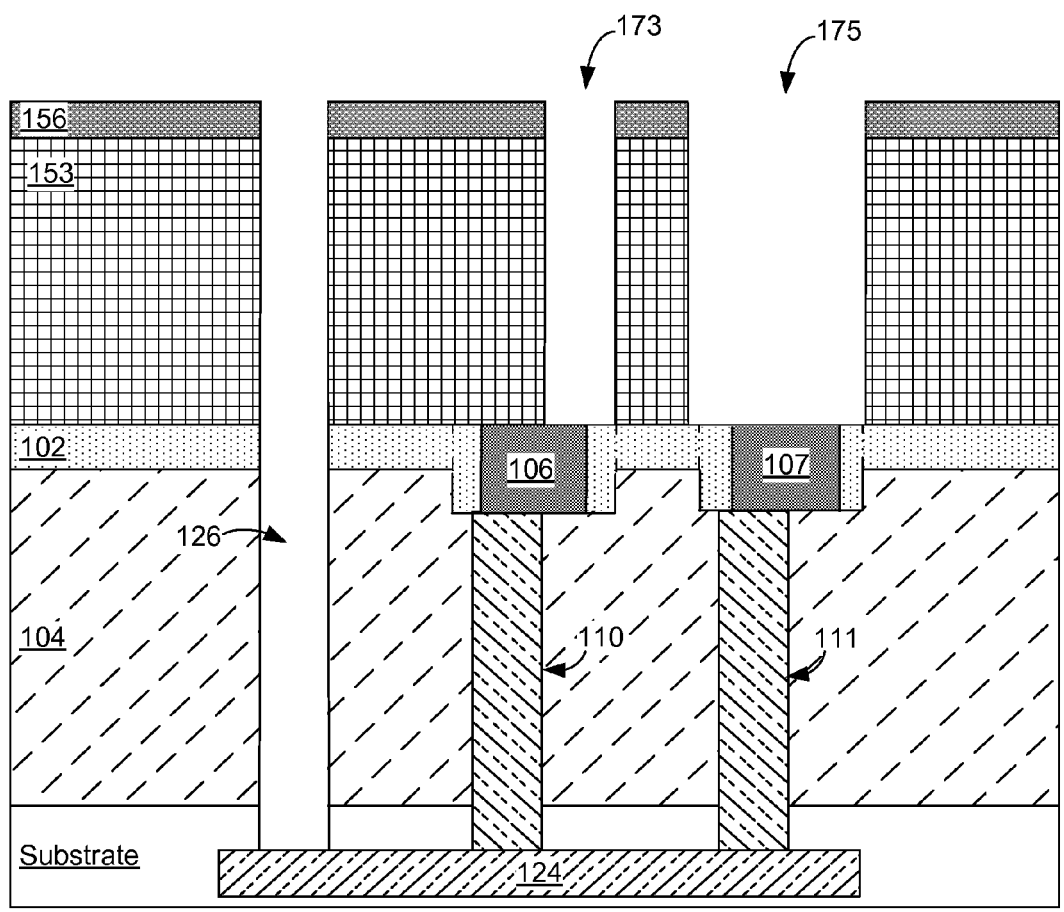
FIG. 11B illustrates a cross-sectional view (along line 186 of FIG. 11A) of the tenth particular stage of forming the device of FIGS. 1A,1B, and 1C.
Figure 11C:
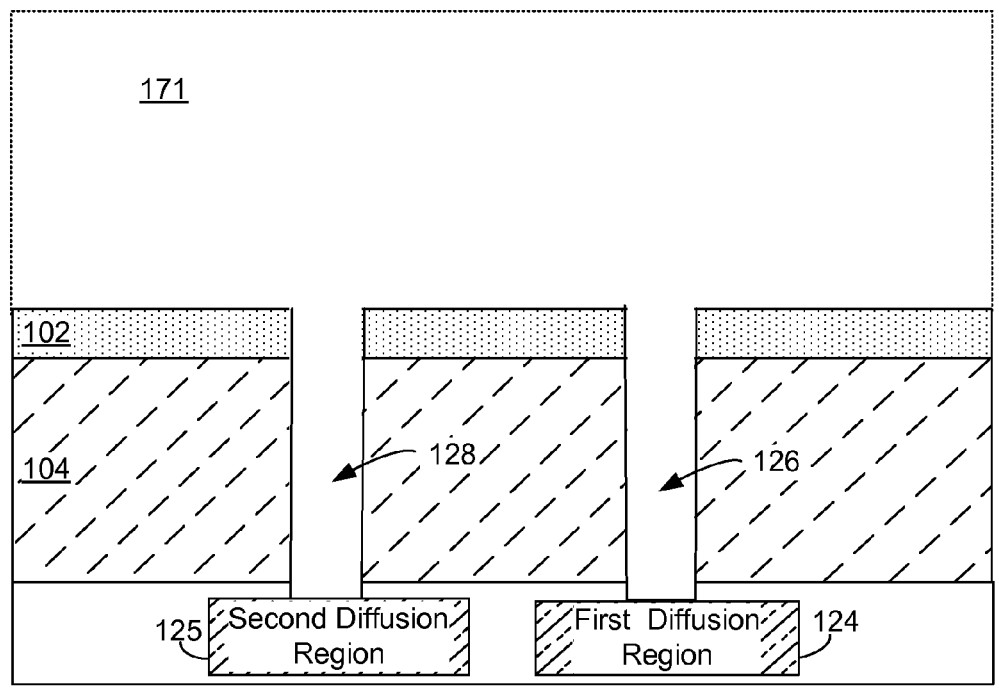
FIG. 11C illustrates a front cross-sectional view (along line 185 of FIG. 11A) of the tenth particular stage of forming the device of FIGS. 1A,1B, and 1C.

FIGS. 11A, 11B, and 11C are a top view, a cross-sectional view along line 186 of FIG. 11A, and a cross-sectional view along line 185 of FIG. 11A during a tenth particular stage, respectively, of forming the electronic device 100 of FIGS. 1A, 1B, and 1C. During the tenth particular stage of forming the electronic device 100 of FIGS. 1A, 1B, and 1C, the first dielectric layer 104 of FIG. 10 is etched (e.g., in a second etch stage) at regions 132 and 133 of FIG. 10 using the pattern 137 (e.g., in the hardmask layer 156). Etching the first dielectric layer 104 of FIG. 10 during the tenth particular stage may form a third trench 126, a fourth trench 128, or both (of FIGS. 11A, 11B, and 11C). The third trench 126 may expose the first diffusion region 124, and the fourth trench 128 may expose the second diffusion region 125. The second dielectric layer 102 may act as an etch stop (e.g., a hard mask) while etching the first dielectric layer 104 of FIG. 10. Because of the different etch characteristics of the second dielectric layer 102 and the first dielectric layer 104, the isolation wall 112 (e.g., of FIGS. 1A, 9A and 9B) prevents the third trench 126 from exposing the contact 106 or the first gate 110. Thus, for example, the isolation wall 112 (e.g., of FIGS. 1A, 9A and 9B) may prevent lateral undercutting (during the etch process to form the third trench 126 of FIGS. 11A, 11B, and 11C) from reaching the contact 106.

FIGS. 1A, 1B, and 1C illustrate a cross-sectional view along line 179 of FIG. 1C, a cross-sectional view along line 150 of FIG. 1C, and a top view, respectively, showing an eleventh particular stage of forming the electronic device 100. The eleventh particular stage may occur before or may be performed after the tenth particular stage of FIGS. 11A, 11B, and 11C. During the eleventh particular stage of forming the electronic device 100, the local interconnect structure 114 may be formed by depositing a second contact material (e.g., tungsten (W)) to form the first leg 116, the second leg 117 and the cross-member 118. The cross-member 118 may connect the first leg 116 and the second leg 117. Contacts 109 may also be formed during the eleventh particular stage by depositing the second contact material using the patterns 138 and 139. The cross-member 118 and the contacts 109 may form at least a portion of the top local interconnect layer 108. The second contact material may be deposited using a deposition technique, such as CVD. The first leg 116, the second leg 117, and the cross-member 118 may form a substantially pi-shaped structure. At least a portion of the first leg 116 may be contiguous with the cross-member 118, at least a portion of the second leg 117 may be contiguous with the cross-member 118, or both. For example, the first leg 116, the second leg 117, and the cross-member 118 may be formed using a single deposition step such that there are no other layers between the first leg 116 and the cross-member 118 and between the second leg 117 and the cross-member 118. Using the stages described above, the local interconnect structure 114, the contacts 109, and the top local interconnect layer 108 can be formed using no more than two masks (e.g., a first mask to guide formation of the first and second trenches 120, 121, a second mask used during formation of the openings 130 and 131 in the second dielectric layer 102 (e.g., by patterning the first photoresist and hardmask bilayers 151 of FIGS. 7A and 7B), and a third mask used during formation of the third and fourth trenches 126 and 128 of FIGS. 11A, 11B, and 11C (e.g., a third mask to pattern the second photoresist and hardmask bilayers 155 of FIGS. 9A and 9B).

Figure 12:
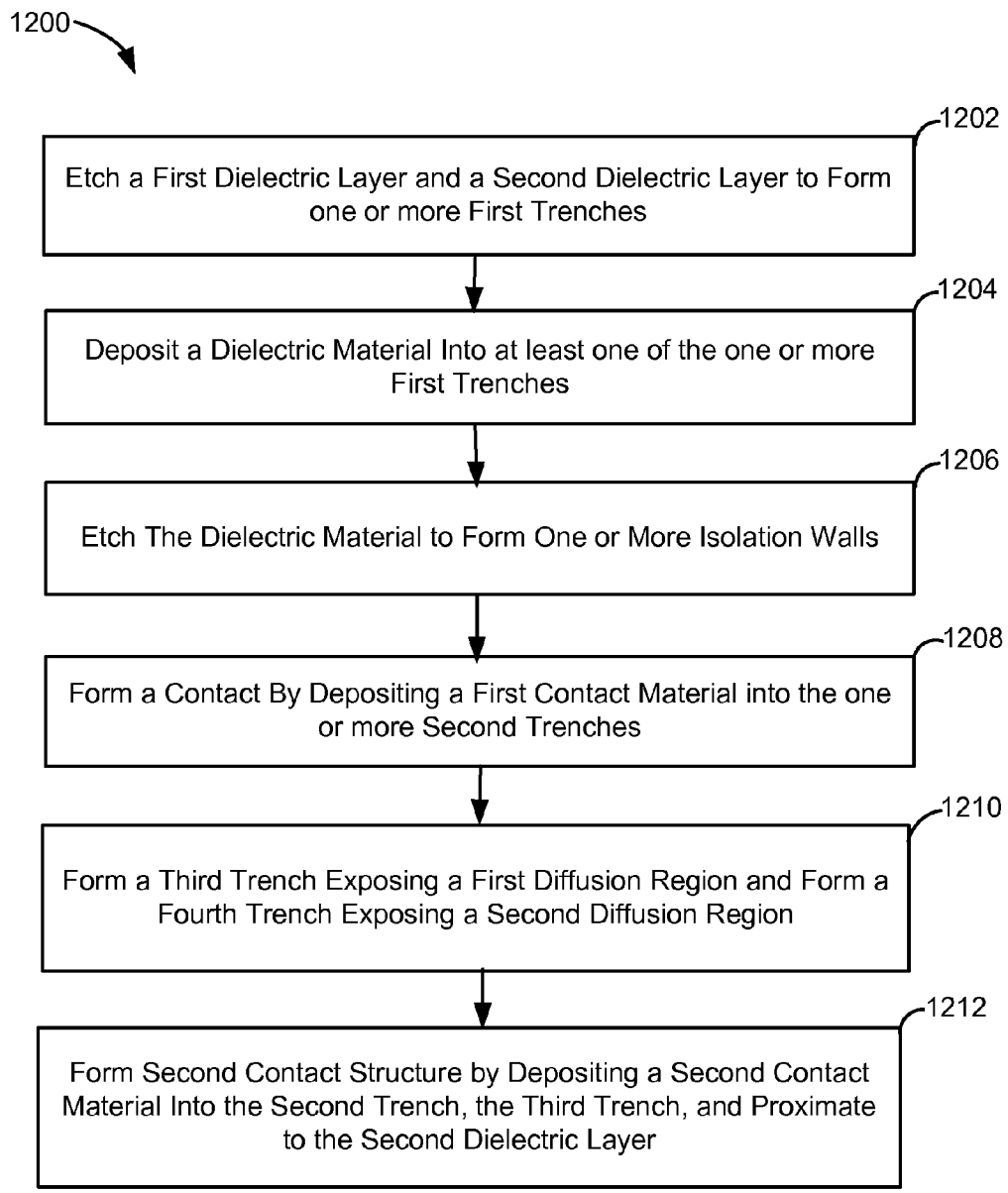
FIG. 12 is a flowchart of a process of forming the device of FIGS. 1A, 1B, and 1C.

Referring to FIG. 12, a flow chart of an illustrative embodiment of a method 1200 of fabricating an electronic device is depicted. The electronic device may correspond to the electronic device 100 of FIGS. 1A, 1B, and 1C. The method 1200 may include the first through eleventh stages described with reference to FIGS. 1A, 1B, 1C, 2, 3A, 3B, 4-6, 7A, 7B, 8A, 8B, 9A, 9B, 10, 11A, 11B, and 11C.

The method 1200 includes etching, at 1202, a first dielectric layer and a second dielectric layer to form one or more first trenches. The first dielectric layer may correspond to the first dielectric layer 104 of FIGS. 1A, 1B, 2, 3A, 3B, 4-6, 8A, 8B, 9A, 10, 11B, and 11C. The second dielectric layer may correspond to the second dielectric layer 102 of FIGS. 1A, 1B, 2, 3A, 3B, 4-6, 7A, 7B, 9A, 10, 11A, 11B, and 11C. The one or more first trenches may correspond to the one or more first trenches 120 of FIGS. 3A and 3B. The one or more first trenches 120 may be formed by etching the first dielectric layer 104 and the second dielectric layer 102 isotropically (e.g., using wet chemical etching) or anisotropically as described with reference to the second particular stage of forming the electronic device 100. As described above, at least one of the one or more first trenches 120 may be formed by etching the first dielectric layer 104 through an opening in the second dielectric layer 102. The opening in the second dielectric layer 102 through which the first dielectric layer 104 is etched may be formed by etching the second dielectric layer 102. One or more of the first trenches 120 may include a portion that laterally extends beyond an edge of one or more of the gates. For example, trench 122 may include a portion 181 that laterally extends beyond an edge 182 of the first gate 110.

The method 1200 includes depositing, at 1204, a dielectric material into at least one of the one or more first trenches. For example, as described above with respect to the third particular stage of FIG. 4, additional dielectric material 141 of the second dielectric layer 102 may be deposited into one or more of the first trenches 120 of FIGS. 3A and 3B. For example, MN may be deposited into the one or more first trenches 120 of FIGS. 3A and 3B. The additional dielectric material 141 deposited into the one or more first trenches 120 may be deposited isotropically using a deposition technique, such as CVD.

The method 1200 includes etching, at 1206, dielectric material to form one or more isolation walls. For example, as described with reference to the fourth particular stage of FIG. 5, at least some of the additional dielectric material 141 deposited into the one or more first trenches 120 of FIGS. 3A and 3B may be etched to form one or more second trenches 121. For example, a portion of (e.g., a portion or layer proximate to the surface 129) the additional dielectric material 141 may be etched isotropically (e.g., using wet chemical etching) or anisotropically to form the one or more second trenches 121. One or more portions of the additional dielectric material 141 proximate to the sidewalls of the one or more first trenches 120 may remain to form the one or more isolation walls 112, 113. At least one of the one or more isolation walls (e.g., the isolation wall 112) may be proximate (e.g., on, over, above, or adjacent) to a top of the first gate 110. In some embodiments, at least a portion of one or more of the isolation walls laterally extends beyond an edge of one or more of the gates. For example, a portion 183 of the isolation wall 112 may laterally extend beyond the edge 182 of the first gate 110.

The method 1200 includes forming, at 1208, contacts by depositing first contact material into the one or more second trenches. For example, as described with reference to the fifth particular stage of FIG. 6, the contacts 106 and 107 may be formed by depositing the first contact material into the one or more second trenches 121 of FIG. 5. The first contact material may include a conductive material, such as metal. For example, the contacts 106 and 107 and may be formed of, or may include, tungsten (W). Additionally, after depositing a material to form the contacts 106 and 107, the electronic device 100 may be planarized. For example, the electronic device 100 may be planarized using CMP.

The method 1200 includes forming, at 1210, a third trench exposing a first diffusion region and a fourth trench exposing a second diffusion region. The third trench 126 may expose the first diffusion region 124, and the fourth trench may expose the second diffusion region 125. The third trench 126 and the fourth trench 128 may be formed as described in the sixth through ninth stages with reference to FIGS. 7A, 7B, 8A, 8B, 9A, 9B, and 10. For example, forming the third trench 126 and fourth trench 128 may include forming first photoresist and hardmask bilayers 151 proximate to the second dielectric layer 102 as generally illustrated with reference to FIGS. 7A and 7B. The first photoresist and hardmask bilayers 151 may be patterned proximate to the first diffusion region 124 and the second diffusion region 125. The first photoresist and hardmask bilayers 151 may be patterned using a first photolithographic step to apply a first photomask to form the pattern 135 in a horizontal direction.

Forming the third trench 126 and the fourth trench 128 may further include forming one or more openings in the second dielectric layer proximate to (e.g., above or over) one or more diffusion regions as generally illustrated with reference to FIGS. 8A and 8B. For example, the opening 130 may be formed in a portion of the second dielectric layer 102 over the first diffusion region 124, and the opening 131 may be formed in a portion of the second dielectric layer 102 over the second diffusion region 125. The openings 130 and 131 may be formed in the second dielectric layer by etching the second dielectric layer 102 through the patterned first photoresist and hardmask bilayers 151 of FIGS. 7A and 7B. The second dielectric layer 102 may be etched isotropically (e.g., using wet chemical etching) or anisotropically. Because of the different etch characteristics of the second dielectric layer 102 and the first dielectric layer 104, the first dielectric layer 104 is not etched during this etch step.

Forming the third trench 126 and the fourth trench 128 may further include forming a third dielectric layer 153 proximate to the second dielectric layer 102, and forming and patterning second photoresist and hardmask bilayers 155 proximate to the third dielectric layer 153, as generally described with reference to FIGS. 9A and 9B. For example, the second photoresist and hardmask bilayers 155 may be patterned to form the patterns 137, 138, and 139. Forming the third trench 126 and the fourth trench 128 may further include etching the third dielectric layer 153 of FIGS. 9A and 9B through the patterns 137, 138, and 139, as generally described with reference to FIG. 10. Etching the third dielectric layer 153 may expose portions of the first dielectric layer 104 (e.g., at regions 132 and 133). The regions 132 and 133 may correspond to portions of the first opening 130 and the second opening 131 in the second dielectric layer 102 proximate to the pattern 137 (e.g., portions of the first opening 130 and the second opening 131 that intersect the pattern 137).

Forming the third trench 126 and the fourth trench 128 may further include etching the first dielectric layer 104 through the pattern 137 as generally illustrated in, and described with reference to, FIGS. 11A, 11B, and 11C. Because of the different etch characteristics of the second dielectric layer 102 and the first dielectric layer 104, the isolation wall 112 (e.g., of FIGS. 1A, 9A, and 9B) prevents the third trench 126 from exposing the first contact 106 or the first gate 110. Thus, for example, the isolation wall 112 may prevent lateral undercutting (during the etch process to form the third trench 126) from reaching the contact 106.

The method 1200 includes forming, at 1212, a local interconnect structure by depositing a second contact material into the second trench, the third trench, and proximate to the second dielectric layer as described above with reference to FIGS. 1A, 1B, and 1C. For example, the local interconnect structure 114 may be formed by depositing second contact material (e.g., tungsten (W)) into the third trench 126 to form the first leg 116, into the fourth trench 128 to form the second leg 117, and proximate to the second dielectric layer 102 to form the cross-member 118. The cross-member 118 may connect the first leg 116 and the second leg 117. Using the stages described above, the electronic device 100 can be formed using no more than three masks (e.g., a first mask to guide formation of the first and second trenches 120, 121, a second mask used during formation of the openings 130 and 131 in the second dielectric layer 102 (e.g., to pattern the first photoresist and hardmask bilayers 151 of FIGS. 7A and 7B), and a third mask used during formation of the third and fourth trenches 126 and 128 of FIGS. 11A, 11B, and 11C (e.g., a third mask to pattern the second photoresist and hardmask bilayers 155 of FIGS. 9A and 9B).

Figure 13:
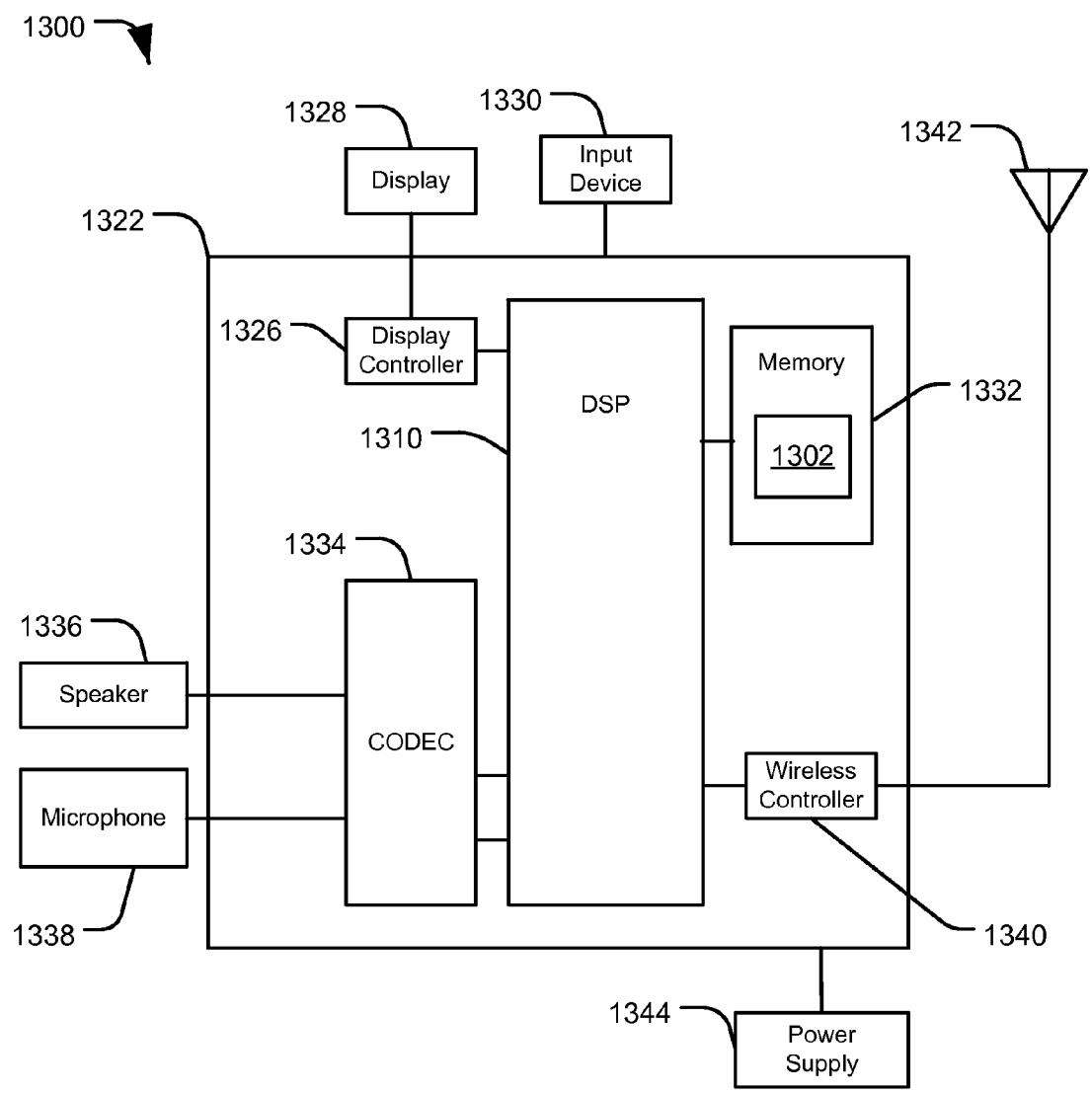
FIG. 13 is a block diagram of a portable device including the device of FIGS. 1A, 1B, and 1C.

Referring to FIG. 13, a block diagram of a particular illustrative embodiment of an electronic device is depicted and generally designated 1300. The electronic device 1300 includes a processor, such as a digital signal processor (DSP) 1310, coupled to a memory 1332. The memory 1332 may include a semiconductor device 1302. The memory 1332 may include one or more transistors (e.g., FinFETs) of the electronic device 100 that include one or more isolation walls formed of aluminum nitride (AlN) and formed between a contact and a first dielectric layer. The one or more transistors may form a semiconductor memory cell array of the memory 1332. For example, a first series of transistors (e.g., n-channel FinFETs) may be formed proximate to the first diffusion region 124 and a second series of transistors (e.g., p-channel FinFETs) may be formed proximate to the second diffusion region 125. A local interconnect structure similar to the local interconnect structure 114 may be formed as described herein, and the local interconnect structure may be located between the gates of each FinFET of the series of n-channel FinFETs and the gates of each FinFET of the series of p-channel FinFETs. The local interconnect structures may operate as a bit line, a word line, or a Vss line in memory cell arrays.

FIG. 13 also shows a display controller 1326 that is coupled to the digital signal processor 1310 and to a display 1328. A coder/decoder (CODEC) 1334 can also be coupled to the digital signal processor 1310. A speaker 1336 and a microphone 1338 can be coupled to the CODEC 1334.

FIG. 13 also indicates that a wireless controller 1340 can be coupled to the digital signal processor 1310 and to an antenna 1342. In a particular embodiment, the DSP 1310, the display controller 1326, the memory 1332, the CODEC 1334, and the wireless controller 1340 are included in a system-in-package or system-on-chip device 1322. In a particular embodiment, an input device 1330 and a power supply 1344 are coupled to the system-on-chip device 1322. Moreover, in a particular embodiment, as illustrated in FIG. 13, the display 1328, the input device 1330, the speaker 1336, the microphone 1338, the antenna 1342, and the power supply 1344 are external to the system-on-chip device 1322. However, each of the display 1328, the input device 1330, the speaker 1336, the microphone 1338, the antenna 1342, and the power supply 1344 can be coupled to a component of the system-on-chip device 1322, such as an interface or a controller.

In conjunction with the described embodiments, a system is disclosed that may include first means for conducting. The first means for conducting may correspond to portions of the top local interconnect layer 108 of FIG. 1A (e.g., one or more of the contacts 109), one or more other devices or circuits configured to conduct charge, or any combination thereof. The system may also include means for electrically coupling the means for conducting to a gate of a semiconductor device through a first dielectric layer. The means for electrically coupling the means for conducting to a gate of a semiconductor device through a first dielectric layer may correspond to the first contact 106 of FIG. 1A. The system may also include means for isolating. The means for isolating may correspond to the one or more isolation walls 112 or 113 of FIG. 1A. The means for isolating may include aluminum nitride (AlN) and may be located between the means for electrically coupling and the first dielectric layer. The system may further include means for masking. The means for masking may correspond to the second dielectric layer 102 of FIGS. 1A and 1B. The means for masking may be located between the means for conducting and the first dielectric layer and may include or be formed of AlN. The means for conducting, the means electrically coupling, or both, may include or be formed of tungsten (W).

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 14.

Figure 14:
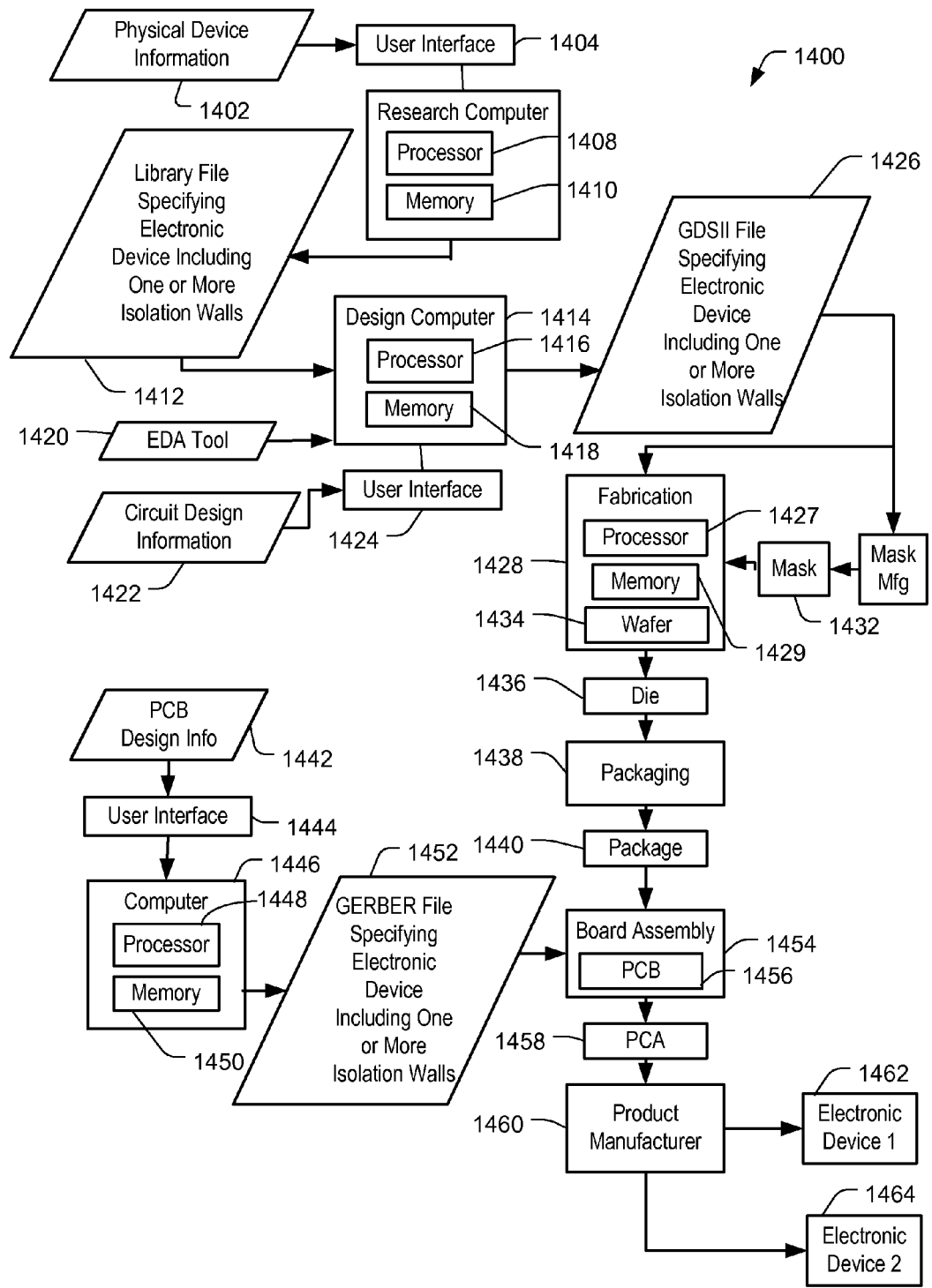
FIG. 14 is a data flow diagram of a particular illustrative embodiment of a manufacturing process to manufacture one or more electronic devices that include the electronic device of FIGS. 1A, 1B, and 1C.

Referring to FIG. 14, a particular illustrative embodiment of an electronic device manufacturing (e.g., fabricating) process is depicted and generally designated 1400. Physical device information 1402 is received at the manufacturing process 1400, such as at a research computer 1406. The physical device information 1402 may include design information representing at least one physical property of a semiconductor device, such as the electronic device 100 of FIGS. 1A, 1B, and 1C. For example, the physical device information 1402 may include physical parameters, material characteristics, and structure information (e.g., of the top local interconnect layer 108, the contact 106 coupling the top local interconnect layer 108 to a gate of the semiconductor device through a first layer, and the one or more isolation walls 112 and/or 113) that is entered via a user interface 1404 coupled to the research computer 1406. The research computer 1406 includes a processor 1408, such as one or more processing cores, coupled to a computer readable medium (e.g., a non-transitory computer-readable storage medium), such as a memory 1410. The memory 1410 may store computer readable instructions that are executable to cause the processor 1408 to transform the physical device information 1402 to comply with a file format and to generate a library file 1412.

In a particular embodiment, the library file 1412 includes at least one data file including the transformed design information. For example, the library file 1412 may include a library of semiconductor devices including a device that includes the top local interconnect layer 108, the contact 106 coupling the top local interconnect layer 108 to a gate of the semiconductor device through a first layer, and the one or more isolation walls 112 or 113 of the electronic device 100 of FIGS. 1A, 1B, and 1C, that is provided for use with an electronic design automation (EDA) tool 1420.

The library file 1412 may be used in conjunction with the EDA tool 1420 at a design computer 1414 including a processor 1416, such as one or more processing cores, coupled to a memory 1418. The EDA tool 1420 may be stored as processor executable instructions at the memory 1418 to enable a user of the design computer 1414 to design an electronic device including the one or more isolation walls 112 or 113 of the electronic device 100 of FIGS. 1A, 1B, and 1C, of the library file 1412. For example, a user of the design computer 1414 may enter circuit design information 1422 via a user interface 1424 coupled to the design computer 1414. The circuit design information 1422 may include design information representing at least one physical property of a semiconductor device, such as the electronic device 100 of FIGS. 1A, 1B, and 1C. To illustrate, the circuit design property may include identification of particular circuits and relationships to other elements in a circuit design, positioning information, feature size information, local interconnection information, or other information representing a physical property of a semiconductor device.

The design computer 1414 may be configured to transform the design information, including the circuit design information 1422, to comply with a file format. To illustrate, the file format may include a database binary file format representing planar geometric shapes, text labels, and other information about a circuit layout in a hierarchical format, such as a Graphic Data System (GDSII) file format. The design computer 1414 may be configured to generate a data file including the transformed design information, such as a GDSII file 1426 that includes information describing the electronic device 100 of FIGS. 1A, 1B, and 1C, in addition to other devices, circuits, or information. To illustrate, the data file may include information corresponding to a system-on-chip (SOC) that includes the electronic device 100 of FIGS. 1A, 1B, and 1C, and that also includes additional electronic circuits and components within the SOC.

The GDSII file 1426 may be received at a fabrication process 1428 to fabricate a device including the one or more isolation walls 112 or 113 of the electronic device 100 of FIGS. 1A and 1B, according to transformed information in the GDSII file 1426. For example, a device manufacturing process may include providing the GDSII file 1426 to a mask manufacturer 1430 to create one or more masks, such as masks to be used with photolithography processing, illustrated as a representative mask 1432. The mask 1432 may be used during the fabrication process to generate one or more wafers 1434, which may be tested and separated into dies, such as a representative die 1436. The die 1436 includes a circuit including a device that includes the electronic device 100 of FIGS. 1A, 1B, and 1C.

For example, the fabrication process 1428 may include a processor 1427 and a memory 1429 to initiate and/or control the fabrication process 1428. The memory 1429 may include executable instructions such as computer-readable instructions or processor-readable instructions. The executable instructions may include one or more instructions that are executable by a computer such as the processor 1427. In a particular embodiment, the executable instructions may cause a computer to perform the method 1200 of FIG. 12 or at least a portion thereof.

The fabrication process 1428 may be implemented by a fabrication system that is fully automated or partially automated. For example, the fabrication process 1428 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD). As other examples, the fabrication equipment may, additionally or alternatively, be configured to pattern materials using a single-mask or multi-mask litho-etch process (e.g., two-mask LELE), to pattern materials using a litho-etch-litho-etch (LELE) process, to pattern materials using a self-aligned double patterning (SADP) process, to epitaxially grow one or more materials, and/or to conformally deposit one or more materials. As a further example, the fabrication equipment may, additionally or alternatively, be configured to apply a hardmask, to apply an etching mask, to perform etching, to perform planarization, to form a gate stack, and/or to perform a standard clean 1 type. In a particular embodiment, the fabrication process 1428 corresponds to a semiconductor manufacturing process associated with a technology node smaller than 14 nm (e.g., 10 nm, 7 nm, etc.). The specific process or combination of processes used to manufacture a device including the electronic device 100 of FIGS. 1A, 1B, and 1C may be based on design constraints and available materials/equipment. Thus, in particular embodiments, different processes may be used than described with reference to FIGS. 1A, 1B, 1C, 2, 3A, 3B, 4-6, 7A, 7B, 8A, 8B, 9A, 9B, 10, 11A, 11B, and 11C to manufacture the device.

As an illustrative example, a two-mask LELE process used during formation of the electronic device 100 of FIGS. 1A, 1B, and 1C may include using a first photoresist mask to form a first pattern on a first layer (e.g., a the second dielectric layer 102 of FIGS. 1A and 1B) of a device and etching the first pattern. A second mask may then be used to form a second pattern on the device and the combined pattern may be etched (e.g., through the first dielectric layer 104 of FIGS. 1A and 1B) down to a second, lower layer (e.g., a diffusion region) of the device. In the combined pattern, features (e.g., lines) of the first pattern and the second pattern may be interleaved. The combined pattern may thus have smaller feature (e.g., line) pitch as compared to the first pattern and the second pattern.

The fabrication system (e.g., an automated system that performs the fabrication process 1428) may have a distributed architecture (e.g., a hierarchy). For example, the fabrication system may include one or more processors, such as the processor 1427, one or more memories, such as the memory 1429, and/or controllers that are distributed according to the distributed architecture. The distributed architecture may include a high-level processor that controls or initiates operations of one or more low-level systems. For example, a high-level portion of the fabrication process 1428 may include one or more processors, such as the processor 1427, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the high-level processor. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 1427.

Alternatively, the processor 1427 may be a part of a high-level system, subsystem, or component of the fabrication system. In another embodiment, the processor 1427 includes distributed processing at various levels and components of a fabrication system.

The executable instructions included in the memory 1429 may enable the processor 1427 to form (or to initiate formation of) the top local interconnect layer 108, the contact 106 coupling the top local interconnect layer 108 to a gate of the semiconductor device through a first layer, and the one or more isolation walls 112 or 113 of the electronic device 100 of FIGS. 1A, 1B, and 1C. In a particular embodiment, the memory 1429 is a non-transitory computer-readable medium storing computer-executable instructions that are executable by the processor 1427 to cause the processor 1427 to initiate formation of a device in accordance with at least a portion of the method 1200 of FIG. 12. For example, the computer executable instructions may be executable to cause the processor 1427 to initiate formation of the top local interconnect layer 108, the contact 106 coupling the top local interconnect layer 108 to a gate of the semiconductor device through a first layer, and the one or more isolation walls 112 or 113 of the electronic device 100 of FIGS. 1A, 1B, and 1C. As an illustrative example, the processor 1427 may initiate or control one or more steps of the method 1200 of FIG. 12.

The die 1436 may be provided to a packaging process 1438 where the die 1436 is incorporated into a representative package 1440. For example, the package 1440 may include the single die 1436 or multiple dies, such as a system-in-package (SiP) arrangement. The package 1440 may be configured to conform to one or more standards or specifications, such as Joint Electron Device Engineering Council (JEDEC) standards.

Information regarding the package 1440 may be distributed to various product designers, such as via a component library stored at a computer 1446. The computer 1446 may include a processor 1448, such as one or more processing cores, coupled to a memory 1450. A printed circuit board (PCB) tool may be stored as processor executable instructions at the memory 1450 to process PCB design information 1442 received from a user of the computer 1446 via a user interface 1444. The PCB design information 1442 may include physical positioning information of a packaged semiconductor device on a circuit board, the packaged semiconductor device corresponding to the package 1440 including the electronic device 100 of FIGS. 1A and, 1B, and 1C.

The computer 1446 may be configured to transform the PCB design information 1442 to generate a data file, such as a GERBER file 1452 with data that includes physical positioning information of a packaged semiconductor device on a circuit board, as well as layout of electrical connections such as traces and vias, where the packaged semiconductor device corresponds to the package 1440 including the electronic device 100 of FIGS. 1A, 1B, and 1C. In other embodiments, the data file generated by the transformed PCB design information may have a format other than a GERBER format.

The GERBER file 1452 may be received at a board assembly process 1454 and used to create PCBs, such as a representative PCB 1456, manufactured in accordance with the design information stored within the GERBER file 1452. For example, the GERBER file 1452 may be uploaded to one or more machines to perform various steps of a PCB production process. The PCB 1456 may be populated with electronic components including the package 1440 to form a representative printed circuit assembly (PCA) 1458.

The PCA 1458 may be received at a product manufacturing process 1460 and integrated into one or more electronic devices, such as a first representative electronic device 1462 and a second representative electronic device 1464. For example, the first representative electronic device 1462, the second representative electronic device 1464, or both, may include or correspond to the electronic device 1300 of FIG. 13. As an illustrative, non-limiting example, the first representative electronic device 1462, the second representative electronic device 1464, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 1462, the second representative device 1464, or both, may include a set top box, an entertainment unit, a navigation device, a personal digital assistant (PDA), monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the package 1440 including the electronic device 100 of FIGS. 1A, 1B, and 1C, is integrated.

As another illustrative, non-limiting example, one or more of the electronic devices 1462 and 1464 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 14 illustrates remote units according to teachings of the disclosure, the disclosure is not limited to these illustrated units. Embodiments of the disclosure may be suitably employed in any device which includes active integrated circuitry including memory and on-chip circuitry. For example, one or more of the electronic devices 1462 and 1464 may include cars, trucks, airplanes, boats, other vehicles, or appliances, such as refrigerators, microwaves, washing machines, security systems, or a combination thereof. In a particular embodiment, one or more of the electronic devices 1462 and 1464 may utilize memory and/or wireless communication.

A device that includes the one or more isolation walls 112 or 113 of the electronic device 100 of FIGS. 1A, 1B, and 1C may be fabricated, processed, and incorporated into an electronic device, as described in the illustrative process 1400. One or more aspects of the embodiments disclosed with respect to FIGS. 1A, 1B, 1C, 2, 3A, 3B, 4, 5, 6, 7A, 7B, 8A, 8B, 9A, 9B, 10, 11A, 11B, 11C, 12, and 13 may be included at various processing stages, such as within the library file 1412, the GDSII file 1426 (e.g., a file having a GDSII format), and the GERBER file 1452 (e.g., a file having GERBER format), as well as stored at the memory 1410 of the research computer 1406, the memory 1418 of the design computer 1414, the memory 1450 of the computer 1446, the memory of one or more other computers or processors (not shown) used at the various stages, such as at the board assembly process 1454, and also incorporated into one or more other physical embodiments such as the mask 1432, the die 1436, the package 1440, the PCA 1458, other products such as prototype circuits or devices (not shown), or any combination thereof. Although various representative stages of production from a physical device design to a final product are depicted, in other embodiments fewer stages may be used or additional stages may be included. Similarly, the process 1400 may be performed by a single entity or by one or more entities performing various stages of the process 1400.

Although one or more of FIG. 1A, 1B, 1C, 2, 3A, 3B, 4, 5, 6, 7A, 7B, 8A, 8B, 9A, 9B, 10, 11A, 11B, 11C, or 12-14 may illustrate systems, devices, and/or methods according to the teachings of the disclosure, the disclosure is not limited to these illustrated systems, devices, and/or methods. Embodiments of the disclosure may be suitably employed in any device that includes integrated circuitry including memory, a processor, and on-chip circuitry.

One or more functions or components of any of FIG. 1A, 1B, 1C, 2, 3A, 3B, 4, 5, 6, 7A, 7B, 8A, 8B, 9A, 9B, 10, 11A, 11B, 11C, or 12-14 as illustrated or described herein may be combined with one or more other portions of another of FIG. 1A, 1B, 1C, 2, 3A, 3B, 4, 5, 6, 7A, 7B, 8A, 8B, 9A, 9B, 10, 11A, 11B, 11C, or 12-14. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
 a top local interconnect layer of a middle-of-line (MOL) stack;
 a conductive structure in direct contact with the top local interconnect layer and in direct contact with a gate of a semiconductor device; and
 one or more isolation walls between the conductive structure and a first dielectric layer, wherein the one or more isolation walls include aluminum nitride (AlN).

2. The apparatus of claim 1, wherein the top local interconnect layer includes tungsten (W).

3. The apparatus of claim 1, further comprising a second dielectric layer between the top local interconnect layer and the first dielectric layer, the second dielectric layer including the one or more isolation walls, and wherein the second dielectric layer includes aluminum nitride (AlN).

4. The apparatus of claim 3, further comprising a local interconnect structure comprising:
 a first leg extending through the first dielectric layer and the second dielectric layer to a first diffusion region;
 a second leg extending through the first dielectric layer and the second dielectric layer to a second diffusion region; and
 a cross-member connecting the first leg and the second leg, wherein at least a portion of at least one of the one or more isolation walls is between the conductive structure and a portion of the local interconnect structure.

5. The apparatus of claim 4, wherein at least a portion of the first leg is contiguous with at least a portion of the cross-member.

6. The apparatus of claim 4, wherein each of the first leg, the second leg, and the cross-member includes tungsten (W).

7. The apparatus of claim 4, wherein the first leg, the second leg, and the cross-member form a substantially pi-shaped structure.

8. An electronic device comprising:
 means for conducting;
 means for electrically coupling the means for conducting to a gate of a semiconductor device, wherein the means for electrically coupling is in direct contact with the means for conducting and in direct contact with the gate; and
 means for isolating located between the means for electrically coupling and a dielectric layer, wherein the means for isolating includes aluminum nitride (AlN).

9. The electronic device of claim 8, further comprising means for masking between the means for conducting and the dielectric layer, wherein the means for masking includes aluminum nitride (AlN).

10. The electronic device of claim 8, wherein the means for conducting includes tungsten (W).

11. The electronic device of claim 8, wherein the means for electrically coupling includes tungsten (W).

\* \* \* \* \*